(12) United States Patent
Hibino et al.

(10) Patent No.: US 8,033,016 B2
(45) Date of Patent: Oct. 11, 2011

(54) METHOD FOR MANUFACTURING AN ELECTRODE AND ELECTRODE COMPONENT MOUNTED BODY

(75) Inventors: Kunio Hibino, Osaka (JP); Yoshihiro Tomura, Osaka (JP); Yoshihiko Yagi, Osaka (JP); Kazuhiro Nishikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 1090 days.

(21) Appl. No.: 11/883,801

(22) PCT Filed: Apr. 14, 2006

(86) PCT No.: PCT/JP2006/307916
§ 371 (c)(1),
(2), (4) Date: Aug. 7, 2007

(87) PCT Pub. No.: WO2006/112384
PCT Pub. Date: Oct. 26, 2006

(65) Prior Publication Data
US 2008/0135283 A1 Jun. 12, 2008

(30) Foreign Application Priority Data

Apr. 15, 2005 (JP) ................. 2005-117891
Apr. 15, 2005 (JP) ................. 2005-117892
May 16, 2005 (JP) ................. 2005-142633

(51) Int. Cl.
*H01K 3/10* (2006.01)
(52) U.S. Cl. .............. 29/852; 29/832; 29/854; 174/260; 438/616

(58) Field of Classification Search ................. 174/260, 174/263; 228/180.22, 248.1; 438/612, 613, 438/616; 29/832, 840, 852, 854
See application file for complete search history.

(56) References Cited

U.S. PATENT DOCUMENTS

| 4,914,814 | A | * | 4/1990 | Behun et al. ................. 29/843 |
| 5,930,603 | A | | 7/1999 | Tsuji et al. |
| 6,109,175 | A | | 8/2000 | Kinoshita |
| 6,429,114 | B1 | | 8/2002 | Hayama et al. |
| 6,503,779 | B2 | * | 1/2003 | Miyazaki ................. 438/616 |
| 7,390,732 | B1 | * | 6/2008 | Watanabe et al. .......... 438/613 |

FOREIGN PATENT DOCUMENTS

| JP | 62-117346 | 5/1987 |
| JP | 01-145826 | 6/1989 |
| JP | 02-284426 | 11/1990 |
| JP | 02-284426 A | 11/1990 |
| JP | 5-166880 | 7/1993 |

(Continued)

OTHER PUBLICATIONS

Japanese Office Action issued in Japanese Patent Application No. 2005-117891, mailed Mar. 23, 2010.

(Continued)

*Primary Examiner* — Donghai D. Nguyen
(74) *Attorney, Agent, or Firm* — McDermott Will & Emery LLP

(57) ABSTRACT

A protruding electrodes is formed on a lead electrode of an electronic component, and the protruding electrodes comprises a first conductor formed on the lead electrode of the electronic component, and a second conductor overlaid on the first conductor by using a transfer mold having a concavity. By virtue of this structure, protruding electrodes of any configuration can be formed in fine pitches.

10 Claims, 21 Drawing Sheets

FOREIGN PATENT DOCUMENTS

| | | |
|---|---|---|
| JP | 9-153495 | 6/1997 |
| JP | 10-163368 | 6/1998 |
| JP | 10-291293 | 11/1998 |
| JP | 11-121645 | 4/1999 |
| JP | 2000-286282 | 10/2000 |
| JP | 2002-093842 | 3/2002 |
| JP | 2003-258017 | 9/2003 |
| JP | 2003-258409 | 9/2003 |
| JP | 2004-228375 | 8/2004 |
| JP | 2004-345134 | 12/2004 |

OTHER PUBLICATIONS

Japanese Office Action issued in Japanese Patent Application No. 2005-117892, mailed Jun. 15, 2010.

Chinese Office Action issued in Chinese Office Action CN 2006800117409 dated on Aug. 22, 2008.

Japanese Office Action issued in Japanese Patent Application No. 2005-117892, dated Feb. 16, 2010.

* cited by examiner

METHOD FOR MANUFACTURING AN ELECTRODE AND ELECTRODE COMPONENT MOUNTED BODY

RELATED APPLICATIONS

This application is the U.S. National Phase under 35 U.S.C. §371 of International Application No. PCT/JP2006/307916, filed on Apr. 1.4, 2006, which in turn claims the benefit of Japanese Application No. 2005-117891, filed on Apr. 15, 2005, Japanese Patent Application No. 2005-117892, filed on Apr. 15, 2005 and Japanese latent Application No. 2005-142633, filed on May 16, 2005, the disclosures of which Applications are incorporated by reference herein.

TECHNICAL FIELD

The present invention relates to fine protruding electrodes formed on any of lead electrodes of an electronic component and wiring electrodes of a substrate for connecting the electronic component, an electronic component mounted body using such electrodes, and a method of manufacturing the same.

BACKGROUND ART

There is a strong demand in recent years for high-density integration and high-density mounting of electronic components such as semiconductor chips because of the desire for high performance and reduction in weight and size of electronic apparatuses such as portable data terminals, and that this is driving a further advancement of semiconductor packages toward miniaturization and multiplication of terminal pins for use as electronic components for such apparatuses. It has now come close to the limit of miniaturization of semiconductor packages in the conventional configuration of using lead frames.

For the above reason, surface-mounted semiconductor packages such as BGA ("Ball Grid Array") and CSP ("Chip Scale Package") have recently become the main stream of the components comprised of semiconductor chips mounted on circuit boards.

For semiconductor packages of these kinds, the wire bonding method, the TAB ("Tape Automated Bonding") method, and the FC ("Flip Chip") bonding method are some of the methods known for electrically connecting semiconductor chips with terminals of a substrate comprised of electrodes and conductor traces.

Numerous ideas have been shown of the BGA and CSP structures using the FC bonding method since it is especially advantageous for miniaturizing semiconductor packages.

For example, the FC bonding method, in general, is a method in which protruding electrodes called bumps are formed in advance on electrodes of a semiconductor chip, and the bumps and terminals on a substrate are connected by thermo-compression while they are aligned in positions.

Electrolytic plating and stud bumping are among a number of the methods used to form bumps beforehand on semiconductor chips. There is a shortcoming in the method of forming bumps by electrolytic plating, that it takes a considerable time and cost for the processing since the bumps need to be formed only of a solder material into the desired size. On the other hand, electrolytic plating causes variations in the size of formed bumps because it is difficult to produce a perfectly uniform distribution of electric current inside a plating tank. In the method of forming bumps only of a solder material, it is also difficult to alleviate the problems of processing time and cost since the variations in the size of the bumps become larger as the time of plating increases. There is also a new method developed to form bumps having metallic cores made of such a material as copper, for instance, in order to ensure reliability of bonded portions of the bumps against humidity. However, it further increases the cost of processing for such reasons as making the forming steps more complex.

On the other hand, the stud bumping is a method of forming bumps by bonding gold wires onto electrodes of a semiconductor chip and cutting them. This method takes a considerable time to process since the bumps are formed one by one on the electrodes of the semiconductor chip. It also has a shortcoming of high cost of manufacturing due to a high price of the gold wires used for the bumps.

A bump transfer method has been developed, in which a batch of bumps are formed at once on electrodes of semiconductor chips in order to solve the above shortcoming. In this method, a bump transfer sheet provided with solder bumps formed on a sheet base is positioned in alignment with the semiconductor chips, and all the bumps on the bump transfer sheet are transferred at once to the semiconductor chips by heat and compression. These methods are disclosed in Japanese Patent Unexamined Publications, Nos. H05-166880 (hereinafter referred to as "patent document 1") and H09-153495 ("patent document 2"), for example.

There is also another technique of composing solder bumps having copper cores to ensure reliability of bonded portions to the solder against humidity, and transferring the batch of bumps at once, as disclosed, for example, in Japanese Patent Unexaminied Publication, No. 2000-286282 ("patent document 3").

The bumps disclosed in the patent documents 1 and 2 have problems, however, as described hereinafter with reference to FIG. 21A to FIG. 21C.

That is, bumps 1800 are formed into spherical shapes by the surface tension of solder on electrodes 1820 of substrate 1810, as shown in FIG. 21A. This gives rise to a problem that shapes of bumps 1800 vary (especially in their height) if amounts of the solder before being melted are not consistent, or when the electrodes are formed in a variety of area sizes.

In addition, since bumps 1800 have spherical shapes, they become barrel shapes 1850 when bonded to bonding electrodes 1840 of electronic component 1830, as shown in FIG. 21B. This produces a concentration of stresses on the bonded portions of bumps 1800 with bonding electrodes 1840, and thereby giving rise to another problem of causing separations, cracks and the like failures in the interfaces with bonding electrodes 1840.

Moreover, because of barrel shapes 1850 of bumps 1800, there is a possibility of short-circuiting 1860 between adjoining bumps 1800, as shows in FIG. 21C, which prevents electrodes 1820 from being formed in narrow pitches. Bonding electrodes 1820 of finer pitches may be possible by reducing the size of bumps 1800. However, it is difficult for bumps of smaller sizes to ensure the reliability of connections since they cannot tolerate warping of electronic component 1830 such is a semiconductor chip.

In the case of the solder bumps shown in the above patent document 3, conductive terminals comprised of metal layers and solder layers laminated on a transfer sheet are heated and compressed to bond them with solder layers on bonding electrodes of a semiconductor chip or the like component. The solder layers are then melted, and the transfer sheet removed when the metal layers are wetted throughout with migrated solders to complete a batch processing of the bumps. However, this method also has a problem of forming fine bumps because the melted solder layers tend to increase sizes of the bumps. In addition, it is also difficult to melt the metal layers of copper, for instance, to complete the bonding if the metal layers are not entirely wetted due to insufficient flow of the melted solder layers, which hence impairs reliability of the connections.

The conductive terminals are formed by the steps of coating a resin layer Serving as the transfer sheet on a copper foil, placing a dry film on the copper foil after the resin is hardened, exposing, developing, and forming a solder layer thereafter by electrolytic plating. The dry film is then removed and the copper foil is etched to form the conductive terminals of a pillar shape. This method thus makes the manufacturing process complex, and has a drawback in view of the productivity and manufacturing cost. It also gives rise to a problem of treating waste fluid and the like substances since it requires an etching process.

SUMMARY OF THE INVENTION

Protruding electrodes of the present invention for connecting an electronic component are formed on any of lead electrodes of the electronic component and wiring electrodes of a substrate. Each of the protruding electrodes has a structure comprising a first conductor formed on any of the lead electrode of the electronic component and the wiring electrode of the substrate, and a second conductor formed on the first conductor in an overlying manner.

Because of this structure, it is possible to form fine protruding electrodes since first conductors determine pitches of the protruding electrodes, and that the pitches remain invariable even when the electronic component is connected by melting second conductors.

A method of manufacturing the protruding electrodes for connection of electronic component of the present invention comprises the steps of filling concavities of a predetermined shape for the protruding electrode formed in a transfer mold with second conductors up to at most a level not to reach an outer face of the concavities, filling the concavities in the transfer mold with first conductors on top of the second conductors up to an even level with the outer face of the concavities, heating the transfer mold after positioning it so that the concavities confront any of the lead electrodes of the electronic component and the wiring electrodes of the substrate, and removing the transfer mold.

According to this method, finely-shaped protruding electrodes can be formed easily since the protruding electrodes are transferred onto the substrate or the electronic component while contained within the concavities in the transfer mold to prevent them from getting out of their shapes during the heating, hardening and melting. This method can also make the protruding electrodes of large aspect ratio freely while maintaining their heights uniform by virtue of the concavities in the transfer mold.

An electronic component mounted body of the present invention comprises an electronic component having lead electrodes, protruding electrodes, each made of a multi-layered structure of a first conductor and a second conductor formed on the lead electrode of the electronic component, and a substrate having wiring electrodes, wherein the wiring electrodes are connected with the second conductors of the protruding electrodes.

Another electronic component mounted body of the present invention comprises a substrate having wiring electrodes, protruding electrodes, each made of a multi-layered structure of a first conductor and a second conductor formed on the wiring electrode of the substrate, and an electronic component having lead electrodes, wherein the lead electrodes are connected with the second conductors of the protruding electrodes.

It becomes possible by these structures to achieve the electronic component mounted body, in which fine protruding electrodes formed in small pitches on any of the lead electrodes of the electronic component and the wiring electrodes of the substrate are connected with any of the wiring electrodes of the substrate and the lead electrodes of the electronic component.

A method of manufacturing the electronic component mounted body of the present invention comprises the steps of filling concavities of a predetermined shape for a protruding electrode formed in a transfer mold with second conductors up to at most a level not to reach an outer face of the concavities, filling the concavities in the transfer mold with first conductors on top of the second conductors up to an even level with the outer face of the concavities, heating the transfer mold after positioning it so that the concavities confront any of the lead electrodes of the electronic component and the wiring electrodes of the substrate, forming protruding electrodes on any of the lead electrodes of the electronic component and the wiring electrodes of the substrate by removing the transfer mold, and connecting the protruding electrodes on any of the lead electrodes of the electronic component and the wiring electrodes of the substrate with the other of the lead electrodes of the electronic component and the wiring electrodes of the substrate.

According to this method, finely-shaped protruding electrodes can be formed in small pitches on any of the lead electrodes of the electronic component and the wiring electrodes of the substrate. In addition, the first conductors harden progressively when the lead electrodes of the electronic component and the wiring electrodes of the substrate are connected together even if the protruding electrodes are heated to a temperature above a hardening temperature of the second conductors since the hardening temperature or the melting point of the second conductors is higher than that of the first conductors. For this reason, the protruding electrodes can maintain their shapes during the process of connection, so as to achieve the electronic component mounted body with narrowly spaced connections.

Another method of manufacturing the electronic component mounted body according to the present invention is a method for electrically connecting a wiring substrate provided with a plurality of wiring electrodes with an electronic component having a plurality of lead electrodes in positions corresponding to the wiring electrodes, wherein the method comprises the steps of filling concavities in a transfer mold with a conductive material, the concavities having a predetermined shape of two or more tiered structure of protruding electrode formed in positions corresponding to any of the plurality of wiring electrodes and the plurality of lead electrodes, forming conductors and voids above the conductors in the concavities by heating, hardening and shrinking the conductive material, filling the voids with a first insulation resin, positioning the transfer mold into alignment so that the concavities confront any of the wiring electrodes and the lead electrodes, heating the transfer mold at a temperature capable of semi-hardening at least the first insulation resin, forming the protruding electrodes by removing the transfer mold, forming a second insulation resin on a surface of the conductors of the protruding electrodes on any of the wiring substrate and the electronic component, positioning any of the wiring electrodes and the lead electrodes in a manner to confront the conductors of the protruding electrodes, and hardening the second insulation resin while connecting the wiring electrodes and the lead electrodes through the conductors of the protruding electrodes.

This method can easily achieve the electronic component mounted body with finely spaced connections since the protruding electrodes having the conductors are transferred while being fixed temporarily with the first insulation resin. This method can also make the conductors of large aspect ratio freely while maintaining heights of the protruding electrodes uniform by virtue of the concavities in the transfer mold.

Figure 1A:
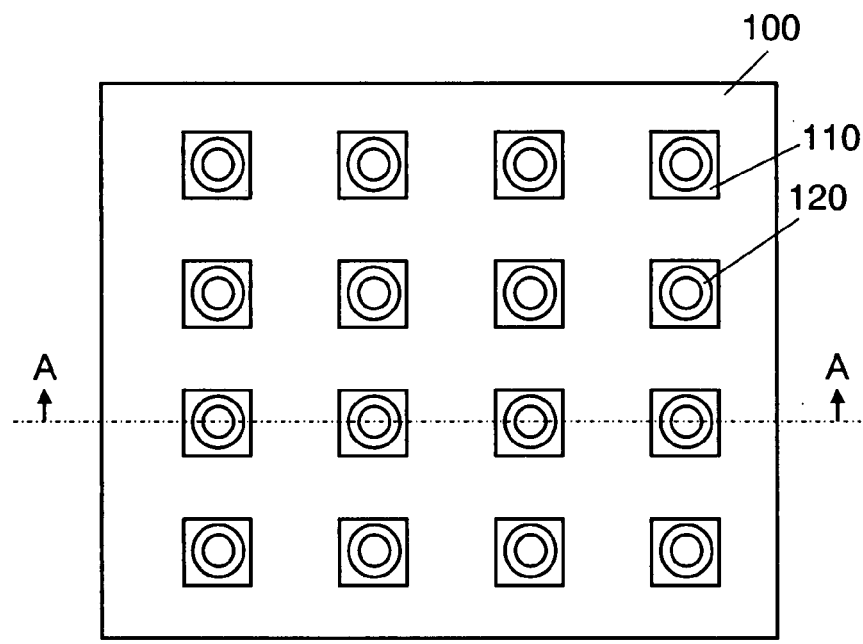
FIG. 1A is a plan view of an electronic component having protruding electrodes according to a first exemplary embodiment of the present invention.

REFERENCE MARKS IN THE DRAWINGS 100, 430, 500, 700, 1000 and 1400 electronic component
110, 440, 510, 710, 1010 and 1410 lead electrode
120 and 1310 protruding electrode
130 and 1540 first conductor
140 and 1640 second conductor
150, 300, 1150, 1250 and 1550 transfer mold
160, 310, 1160 and 1350 concavity
170, 350, 1170, 1270 and 1570 squeegee
180, 1180, 1280 and 1580 outer surface of concavity
190, 1190, 1290 and 1590 void
200, 1100, 1200 and 1500 substrate
210, 1120 and 1320 wiring trace
220, 410, 610 and 910 wiring electrode
230 drum-like shape
250, 450, 650, 750, 1050 and 1450 electronic component mounted body
320 conductor-forming cavity
330 conductor-retaining cavity
340 conductive materials
360, 140 and 1340 conductor
370 void
380 first insulation resin
390 intermediate structure of transfer mold
400, 600 and 900 wiring substrate
420, 520, 720 and 920 second insulation resin
730 and 1030 injection device
740 and 1040 space
1020 conductive layer
1130 and 1330 insulation resin
1360 and 1560 closed-bottom cavity
1520 first wiring trace
1530 first insulation resin
1620 second wiring trace
1630 second insulation resin

DETAILED DESCRIPTION OF THE PREFERRED EMBODIMENTS

Referring now to the drawings, description is provided hereinafter of exemplary embodiments of the present invention. In the following embodiments, the term "protruding electrode for connecting electronic component" is abbreviated to "protruding electrode" unless specially needed to describe it clearly.

First Exemplary Embodiment

Figure 1B:
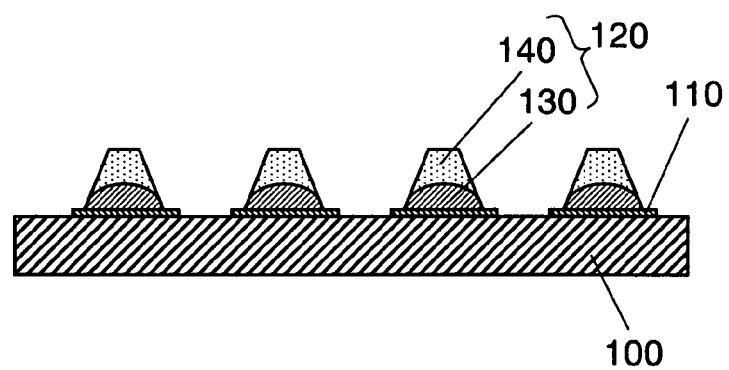
FIG. 1B is a sectional view taken along the line A-A in FIG. 1A.

FIG. 1A is a plan view of an electronic component having protruding electrodes according to the first exemplary embodiment of the present invention, and FIG. 1B is a sectional view taken along the line A-A in FIG. 1A.

In FIG. 1A, protruding electrodes 120 are formed on lead electrodes 110 of electronic component 100 such as a semiconductor chip. Each of protruding electrodes 120 is comprised of first conductor 130 adjoining lead electrode 110, and second conductor 140 overlaid on top of first conductor 130, as shown in FIG. 1B. Protruding electrodes 120 can be formed in fine pitches and of an uniform height since they are molded with a transfer mold having concavities, as will be described in the following manufacturing method.

In this embodiment, first conductors 130 are composed of a conductive resin containing a conductive filler, a thermosetting resin, and the like. Some examples of materials used as the conductive filler are metal powder of silver, copper, gold, nickel, palladium, tin and the like, and alloy of these metals. The thermosetting resin can be any one or a mixture of two or more materials selected from the group of epoxy resin, phenolic resin, polyimide resin, polyurethane resin, melamine resin, urea resin, and the like. The epoxy resin is especially desirable in view of its properties of improving viscosity and hardening reaction of the conductive resin, and a strength of bonding to lead electrodes 110.

Second conductors 140 may be made of a conductive resin similar to the one used for first conductors 130 or a solder material. When second conductors 140 are made of a conductive resin, it is desirable that the material has a higher hardening temperature than that of first conductors 130. Furthermore, when solder is used for second conductors 140 in combination with a flexible substrate such as PET (i.e., polyethylene terephthalate), it is desirable that the solder is a low melting point solder with the melting point of 150° C. or lower. This is because resistances of connections between electronic component 100 and wiring electrodes of the substrate have a significant influence upon performances of electronic component 100 when used in a high frequency circuit, etc., and it is therefore desirable to achieve the connections of low resistances by way of fusion bonding. However, if first conductors 130 have a higher hardening temperature than that of second conductors 140, second conductors 140 become hardened first that they cannot be melted again to make the fusion bonding when connecting them with the wiring electrodes of another substrate. If protruding electrodes 120 are formed at a temperature below the hardening temperatures of first conductors 130 and second conductors 140, first conductors 130 do not harden while second conductors 140 harden because of the high hardening temperature of first conductors 130, which can result in a change in the shape of protruding electrodes 120 due to thermal deformation. This causes flattening of first conductors 130 by a pressure in the process of connection, thereby making them difficult to form fine protruding electrodes 120.

For this reason, the hardening temperature of first conductors 130 is set to be lower than that of second conductors 140 according to the first exemplary embodiment of this invention. This obviates the thermal deformation of first conductors 130 since first conductors 130 continue to harden further at a temperature equal to or higher than the hardening temperature of second conductors 140. When second conductors 140 are made of solder, however, the hardening temperature of first conductors 130 may be set higher than the melting point of the solder, or second conductors 140. The reason of this is that the once-solidified solder can be melted again to make fusion bond connections by heating it to temperatures higher than the melting point.

On the other hand, when second conductors 140 and the wiring electrodes of the other substrate are connected by any of ultrasonic welding, pressure welding, crimp-on bonding and the like, there are no restrictions specifically on protruding electrodes 120 so long as they are hardened, or melted and hardened at temperatures higher than the hardening temperatures or the melting points of first, conductors 130 and second conductors 140.

In addition, protruding electrodes 120 can effectively absorb stresses even if they receive thermal stresses and external impacts since at least any of first conductors 130 and second conductors 140 are made of the conductive resin. This feature provides an advantageous effect on reliability of the connection with wiring electrodes of another substrate.

Referring now to FIG. 2A to FIG. 2F, description is provided hereinafter of a method of manufacturing protruding electrodes of the first exemplary embodiment of this invention by using an example, in which the protruding electrodes are formed on lead electrodes of an electronic component such as a semiconductor chip. This method is also applicable to protruding electrodes formed on wiring electrodes of a substrate.

FIG. 2A to FIG. 2F are sectional views illustrating the method of manufacturing protruding electrodes according to the first exemplary embodiment of this invention.

Figure 2A:
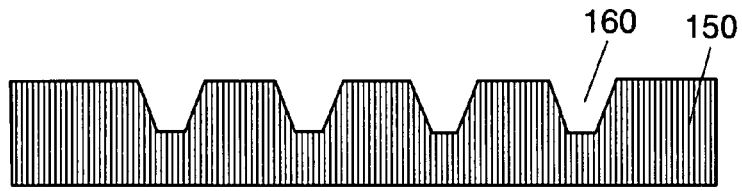
FIG. 2A is a sectional view illustrating a method of manufacturing the protruding electrodes according to the first exemplary embodiment of the present invention.

Provided first is transfer mold 150 having concavities 160 formed in the positions corresponding to where the protruding electrodes are formed, as shown in FIG. 2A. Transfer mold 150 used here is made of a transfer mold resin such as a thermosetting type silicone resin having a low elasticity and a high mold-releasing property. One of the reasons is that silicone resin exhibits an excellent mold-releasing property to conductive resins and solder materials. Another reason is of its low elasticity, which facilitates removal of the protruding electrodes without causing any damages in their shapes when being transferred even when the concavities have a complicated configuration. Still another reason is of its feature of deformability corresponding to a shape of an electronic component, even if irregularly warped, so as to make the protruding electrodes easily transferable to the electronic component.

Concavities 160 can be formed in transfer mold 150 made of a transfer mold resin by such a method as imprinting or intaglio printing by using a metal mold provided with a configuration of the protruding electrodes having 10 μm to 300 μm in diameter, 10 μm to 300 μm in height, and approximately 0.2 to 10 in the aspect ratio, for example. Transfer mold 150 can be formed, for instance, by pouring the transfer mold resin such as a thermosetting type silicone resin into the metal mold, and hardening it under the condition of 150° C. in temperature for 0.5 hours. In addition, a mold releasing agent such as a silicone lubricant and a fluorine lubricant may be coated at least inside of concavities 160 of transfer mold 150 to help improve the releasability.

Figure 2B:
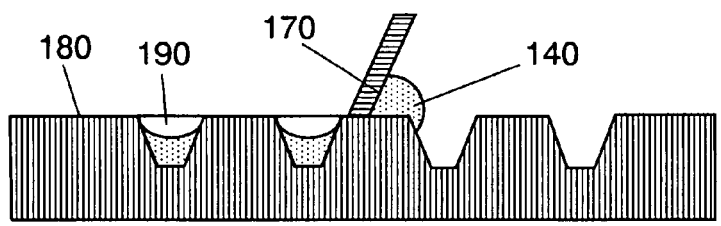
FIG. 2B is another sectional view illustrating the method of manufacturing the protruding electrodes according to the first exemplary embodiment of the invention.

Next, concavities 160 of transfer mold 150 are filled with second conductors 140 consisting of a pasty conductive resin, for instance, by using squeegee 170 up to at most a level not to reach outer face 180 of concavities 160 so as to leave voids 190 therein, as shown in FIG. 2B. In this instance, an amount of second conductors 140 poured in concavities 160 can be controlled by adjusting the size of meshes of: a mask used for screen printing, for instance. Alternatively, voids 190 may be formed by filling concavities 160 with second conductors 140 up to an even level with outer face 180 of concavities 160, and drying them with natural air or at any temperatures below the hardening point. Or, voids 190 may also be formed by pressing second conductors 140 forcibly into concavities 160 with a roller made of a material having a weak adhesion to second conductors 140 (e.g., fluorocarbon resin, etc.).

Figure 2C:
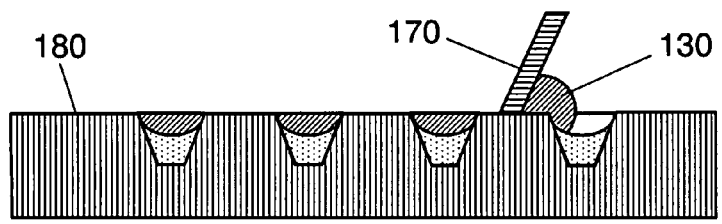
FIG. 2C is another sectional view illustrating the method of manufacturing the protruding electrodes according to the first exemplary embodiment of the invention.

Next, voids 190 formed inside concavities 160 are filled with first conductors 130 consisting of a pasty conductive resin, for instance, of a hardening temperature lower than that of second conductors 140 up to at least an even level with outer face 180 of concavities 160, as shown in FIG. 2C, by using squeegee 170 in the like manner as second conductor 140.

Figure 2D:
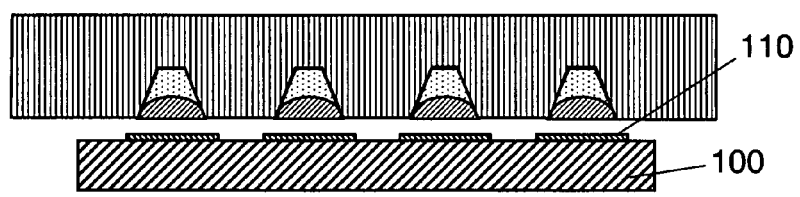
FIG. 2D is another sectional view illustrating the method of manufacturing the protruding electrodes according to the first exemplary embodiment of the invention.

Transfer mold 150 having its concavities 160 filled with first conductors 130 and second conductors 140 is then positioned in alignment with electronic component 100 such as a semiconductor chip having lead electrodes 110, as shown in FIG. 2D.

Figure 2E:
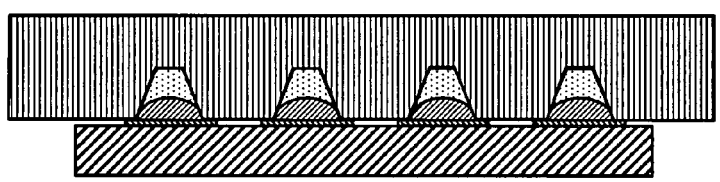
FIG. 2E is still another sectional view illustrating the method of manufacturing the protruding electrodes according to the first exemplary embodiment of the invention.

While lead electrodes 110 of electronic component 100 and concavities 160 of transfer mold 150 are held in the aligned position, as shown in FIG. 2E, they are heated at a temperature higher than the hardening temperature of second conductors 140 to harden protruding electrodes 120.

If second conductors 140 are formed of a solder having a melting point not higher than the hardening temperature of first conductors 130, they may be heated at a temperature equal to or higher than the hardening temperature. If the melting point of the solder is equal to or higher than the hardening temperature of first conductors 130, they can be heated at the same or a higher temperature than the melting point.

The above steps harden protruding electrodes 120 on lead electrodes 110 of electronic component 100 into the same shape as that of concavities 160.

Figure 2F:
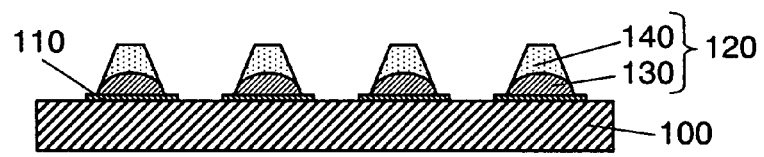
FIG. 2F is yet another sectional view illustrating the method of manufacturing the protruding electrodes according to the first exemplary embodiment of the invention.

Accordingly, protruding electrodes 120 having generally the same shape as the concavities and of an uniform height are transferred on lead electrodes 110 of electronic component 100, as shown in FIG. 2F, when the transfer mold is removed.

The above conditions of temperatures to harden protruding electrodes 120 are based on the assumption that they are connected to wiring electrodes of another substrate or the like member by means of pressure welding, crimp-on bonding, or ultrasonic welding in the final state, and the conditions illustrated above are therefore not meant to restrict the scope of this invention. When protruding electrodes 120 are to be connected to wiring electrodes of another substrate by fusion bonding, for instance, second conductors 140 may be brought into a semi-hardened state by subjecting protruding electrodes 120 to the hardening process at a temperature not lower than the hardening temperature of first conductors 130 but not higher than the hardening temperature of second conductors 140. Second conductors 140 are then melted or softened at the temperature equal to or higher than the hardening temperature of second conductors 140 when connecting and bonding protruding electrodes 120 to the wiring electrodes of another substrate.

When solder is used for the second conductors, the first conductors may be hardened first, and the protruding electrodes are then hardened or solidified at the temperature equal to or higher than the melting temperature of the solder. This is because the first conductors never soften again once they become hardened at or above their hardening temperature. Accordingly, the protruding electrodes can be connected to the wiring electrodes of the other substrate by melting again the second conductors, or the solder, without impairing the shape of the protruding electrodes.

As a result, this embodiment achieves the connections of low resistances and improves reliability of the connections and bonding strength since the second conductors of the protruding electrodes and the wiring electrodes can be connected by means of fusion bonding.

Second Exemplary Embodiment

Figure 3A:
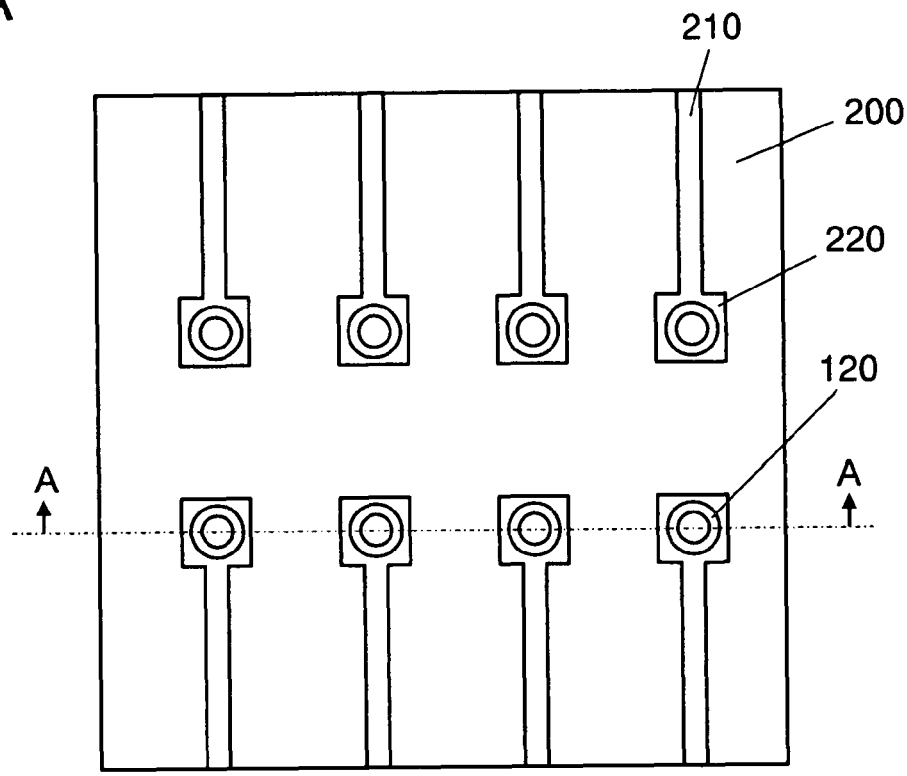
FIG. 3A is a plan view of a substrate having protruding electrodes according to a second exemplary embodiment of the present invention.
Figure 3B:
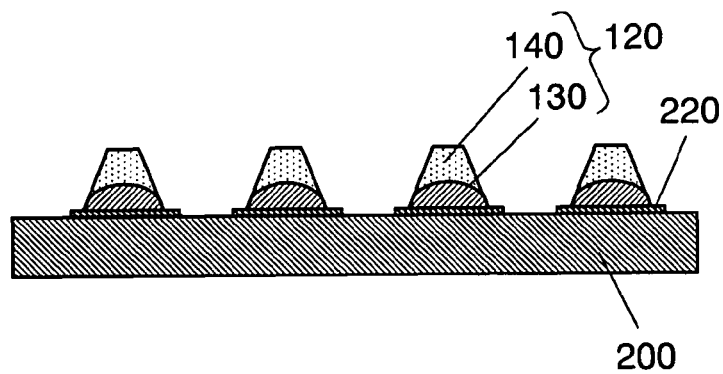
FIG. 3B is a sectional view taken along the line A-A in FIG. 3A.

FIG. 3A is a plan view of a substrate having protruding electrodes according to the second exemplary embodiment of the present invention, and FIG. 3B is a sectional view taken along the line A-A in FIG. 3A.

In FIG. 3A, protruding electrodes 120 are formed on wiring electrodes 220 of substrate 200 provided with wiring traces 210. Each of protruding electrodes 120 is comprised of first conductor 130 adjoining wiring electrode 220 of substrate 200, and second conductor 140 overlaid on top of first conductor 130 in the like manner as the first exemplary embodiment. Here, materials suitable for substrate 200 include organic substrates such as a glass epoxy substrate made of a glass cloth impregnated with epoxy resin, thermosetting resins such as PET ("polyethylene terephthalate") resin and polyimide, and inorganic substrates such as ceramic. When an organic substrate such as PET is used for substrate 200, it is desirable that second conductors 140 of protruding electrodes 120 are formed of a solder of low melting point such as a lead-free solder composed of indium (In)-tin (Sn) or bismuth (Bi)-tin (Sn) having a melting point not higher than 150° C. in order to prevent substrate 200 from being deformed at a temperature of the melting point.

According to the second exemplary embodiment of this invention, protruding electrodes 120 can be formed on wiring electrodes 220 of substrate 200 with a transfer mold having concavities. The invention can thus make the substrate provided with the protruding electrodes in fine pitches and of an uniform height.

Third Exemplary Embodiment

Figure 4:
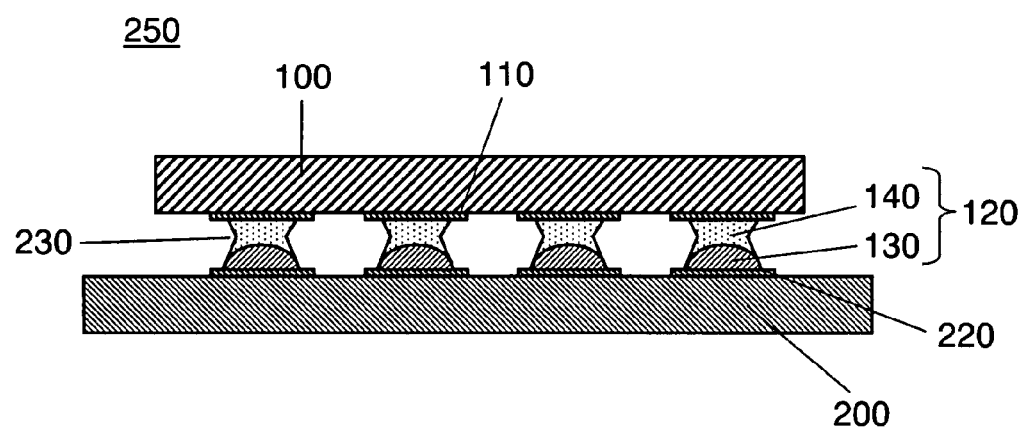
FIG. 4 is a sectional view of an electronic component mounted body according to a third exemplary embodiment of the present invention.

FIG. 4 is a sectional view of an electronic component mounted body according to the third exemplary embodiment of the present invention.

FIG. 4, electronic component mounted body 250 is formed by connecting protruding electrodes 120 formed on wiring electrodes 220 of substrate 200, as discussed in the second exemplary embodiment, with lead electrodes 110 of electronic component 100 such as a semiconductor chip. In this instance, the connections are made between lead electrodes 110 of electronic component 100 and second conductors 140 of protruding electrodes 120.

In other words, the reliable connections can be ensured since second conductors 140 are connected to lead electrodes 110 of electronic component 100 in a state fusion bonding as will be described later. In addition, first conductors 130 keep their shapes unchanged at the hardening temperature of second conductors 140 because the hardening temperature of first conductors 130 is lower than that of second conductors 140. Therefore, protruding electrodes 120 can be connected to lead electrodes 110 of electronic component 100 while maintaining their shapes as they are when transferred to wiring electrodes 220 of substrate 200.

When second conductors 140 are made of solder, for instance, the connections are established with protruding electrodes 120 formed into such a configuration that the middle portion becomes thinner, or so-called drum-like shape 230 as shown in FIG. 4, when the solder is re-melted due to the high wettability with lead electrodes 110 of electronic component 100.

This realizes highly reliable connections in which separation is not likely to occur in the interfaces between lead electrodes 110 and protruding electrodes 120 since the concentration of stresses is alleviated in the interfaces as compared with the conventional solder bumps, which tend to become barrel shapes.

In view of making protruding electrodes 120 of drum-like shape 230, it is more effective in this case to reduce a size of surfaces of protruding electrodes 120 that come in contact with lead electrodes 110, as compared to the size of lead electrodes 110, since second conductors 140 spread over the entire surfaces of lead electrodes 110.

Figure 5A:
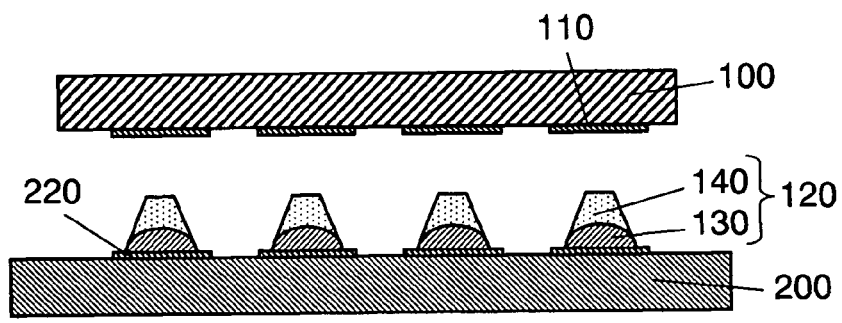
FIG. 5A is a sectional view illustrating a method of manufacturing the electronic component mounted body according to the third exemplary embodiment of the invention.
Figure 5B:
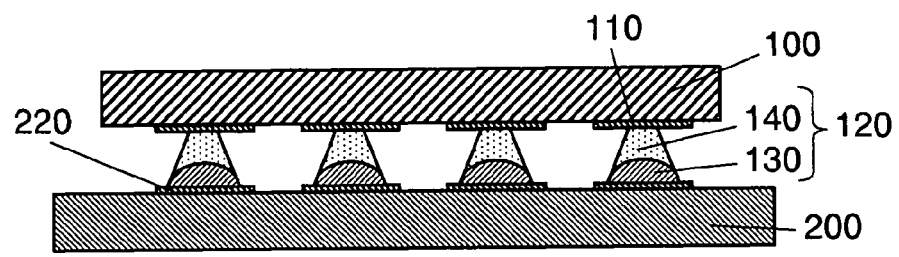
FIG. 5B is another sectional view illustrating the method of manufacturing the electronic component mounted body according to the third exemplary embodiment of the invention.
Figure 5C:
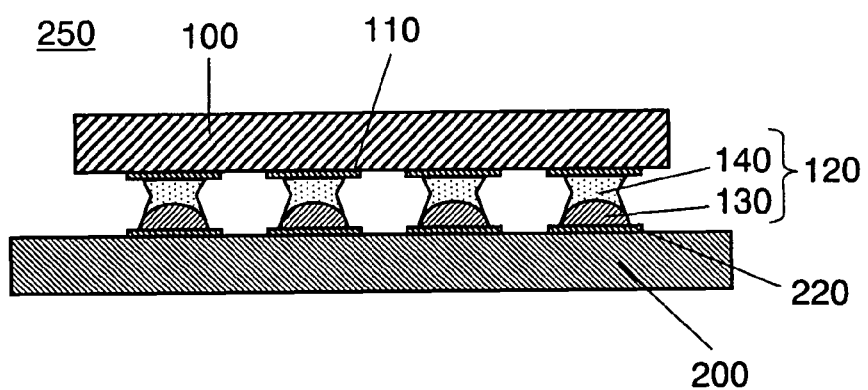
FIG. 5C is still another sectional view illustrating the method of manufacturing the electronic component mounted body according to the third exemplary embodiment of the invention.

Referring to FIG. 5A to FIG. 5C, description is provided hereinafter of a method of manufacturing electronic component mounted body according to the third exemplary embodiment of this invention. In the following method, description is given of an example of the electronic component mounted body manufactured by fusion bonding of the protruding electrodes.

FIG. 5A through FIG. 5C are sectional views illustrating the method of manufacturing electronic component mounted body in the third exemplary embodiment of this invention.

First, electronic component 100 such as a semiconductor chip is positioned above substrate 200 made of such a material as a glass epoxy resin in a manner that electrodes 110 of electronic component 100 confront protruding electrodes 120 formed on wiring electrodes 220 according to the first exemplary embodiment, as shown in FIG. 5A. Protruding electrodes 120 in this stage are such that second conductors 140, if made of a conductive resin, are in a semi-hardened state by being hardened at a temperature not lower than the hardening temperature of first conductors 130 but not higher than the hardening temperature of second conductors 140. However, there is no restriction of this kind, but second conductors 140 need to be melted once and solidified if made of a solder material.

Next, lead electrodes 110 of electronic component 100 are brought into contact with second conductors 140 of protruding electrodes 120, as shown in FIG. 5B, and they are heated at a temperature equal to or higher than the hardening temperature or the melting point of second conductors 140. In this step, a pressure may also be applied at the same time with the heating.

As a result, lead electrodes 110 of electronic component 100 are connected with wiring electrodes 220 of substrate 200 through protruding electrodes 120 by fusion bonding, to thereby complete electronic component mounted body 250, as shown in FIG. 5C. Protruding electrodes 120 of the drum-like shape having a contracted middle portion can be formed easily especially when second conductors 140 of protruding electrodes 120 are made of solder, as described above. The shape of protruding electrodes 120 need not be the drum-like shape, however, but all what is desired is the connections made by the fusion bonding of second conductors 140.

In the third exemplary embodiment of this invention, what has been described is an example of manufacturing the electronic component mounted body by forming the protruding electrodes on the wiring electrodes of the substrate and connecting them with the lead electrodes of the electronic component. However, the scope of this invention is not limited to this example. An electronic component mounted body may be made by forming the protruding electrodes on lead electrodes of an electronic component with a transfer mold and connecting them with wiring electrodes of a substrate, and this also achieves similar advantages.

Description is provided more concretely based on some embodied samples of protruding electrodes and electronic component mounted bodies composed of various combinations of first conductors and second conductors produced according to the first exemplary embodiment to the third exemplary embodiment of this invention.

Embodied Sample 1

In embodied sample 1, first conductors are formed by using a conductive resin of epoxy-base polymer composed mainly of a conductive filler of silver powder, and second conductors are formed of a solder of Sn42 Bi58.

First, a transfer mold having concavities formed therein was prepared with a thermosetting type silicone resin.

The concavities corresponding to protruding electrodes were formed in the transfer mold by the imprinting method using a metal mold provided with a configuration of the protruding electrodes having 50 μm in diameter, 100 μm in height, and at regular pitches of 200 μm. The transfer mold was molded by pouring the thermosetting type silicone resin into the metal mold, and hardening it under the conditions of 150° C. in hardening temperature and for a hardening time of 30 minutes.

The concavities in the transfer mold were filled with second conductors consisting of a solder paste of Sn42 Bi58 having a melting point of 139° C. up to at most a level not to reach an outer face of the concavities in a manner to leave voids therein. In this instance, an amount of the second conductors poured into the concavities was controlled by adjusting the size of meshes of a mask used for the screen printing. The second conductors were then dried at 100° C. for one minute to provide the voids in the concavities.

Next, the voids formed inside the concavities were filled with first conductors consisting of an epoxy-base conductive resin composed mainly of a conductive filler of silver powder having a hardening temperature of 160° C. by using the same method as the second conductors.

The transfer mold was then positioned so that the concavities filled with the first conductors and the second conductors are in alignment with wiring electrodes of a substrate.

While the wiring electrodes of the substrate and the concavities of the transfer mold were held in the aligned position, they were heated at a temperature of 170° C., which is higher than the hardening temperature of the first conductors, for 5 minutes. This process melted the solder paste of the second conductors while hardening the first conductors at the same time, and formed the protruding electrodes when solder was formed with decrease in the temperature. During this process, there were areas developed, where a mixture of the conductive resin and the solder was formed in the vicinities of interfaces between the first conductors and the second conductors, which improved the bonding strength.

The protruding electrodes having generally the same shape as the concavities and of an uniform height were transferred and formed on the wiring electrodes of the substrate when the transfer mold was removed.

The substrate having the protruding electrodes formed on its wiring electrodes in the above process was positioned in alignment with lead electrodes of a semiconductor chip, and the semiconductor chip and the associated parts were heated at a temperature of 140° C., which is just above the melting point of the solder of the second conductors, to melt the solder again and to complete the connections between the second conductors of the protruding electrodes and the lead electrodes by fusion bonding of the solder. The solder also formed a drum-like shape with a contracted middle portion in this state. Accordingly, the electronic component mounted body having the connections of excellent reliability was produced.

Embodied Example 2

In embodied sample 2, first conductors are formed by using a conductive resin of epoxy-base polymer composed mainly of a conductive filler of silver powder, and second conductors are formed of a solder of Sn-20In-2.8Ag.

First, a transfer mold having concavities formed therein was prepared with a thermosetting type silicone resin.

The concavities corresponding to protruding electrodes were formed in the transfer mold by the imprinting method using a metal mold provided with a configuration of the protruding electrodes having 30 μm in diameter, 50 μm in height, and at regular pitches of 100 μm. The transfer mold was molded by pouring the thermosetting type silicone resin into the metal mold, and hardening it under the conditions of 150° C. in hardening temperature and for a hardening time of 30 minutes.

The concavities in the transfer mold were filled with second conductors consisting of a solder paste of Sn-20In-2.8Ag having a melting point of 179° C. to 189° C., up to at most a level not to reach an outer face of the concavities in a manner to leave voids therein. In this instance, an amount of the second conductors poured into the concavities was controlled by adjusting the size of meshes of a mask used for the screen printing. The second conductors were then dried at 140° C. for one minute to provide the voids in the concavities.

Next, the voids formed inside the concavities were filled with first conductors consisting of an epoxy-base conductive resin composed mainly of a conductive filler of silver powder having a hardening temperature of 160° C. by using the same method as the second conductors.

The transfer mold was then positioned so that the concavities filled with the first conductors and the second conductors come into alignment with wiring electrodes of a substrate.

While the wiring electrodes of the substrate and the concavities of the transfer mold were held in the aligned position, they were heated for 3 minutes at a temperature of 190° C., which is higher than the melting point of the second conductors. This process melted the solder paste of the second conductors once while hardening the conductive resin of the first conductors, the hardening temperature of which is lower than the melting point, and formed the protruding electrodes when solder was formed with decrease in the temperature. The protruding electrodes having generally the same shape as the concavities and of an uniform height were transferred and formed on the wiring electrodes of the substrate when the transfer mold was removed.

The substrate having the protruding electrodes formed on its wiring electrodes in the above process was positioned in alignment with lead electrodes of a semiconductor chip, and the semiconductor chip was heated at a temperature of 190° C., which is above the melting point of the solder of the second conductors, to melt the solder again and to complete the connections between the second conductors of the protruding electrodes and the lead electrodes by fusion bonding of the solder. The conductive resin constituting the first conductors kept the shape without being softened during this process since it had already hardened when the protruding electrodes were formed.

Accordingly, the electronic component mounted body having the connections of excellent reliability was produced.

Embodied Sample 3

In embodied sample 3, first conductors are formed by using a conductive resin of heat-resistant epoxy-base polymer composed mainly of a conductive filler of silver powder, and second conductors are formed of a two-stage curing type polyimide-base conductive resin composed mainly of a conductive filler of silver powder. In this sample here, the second conductor material has two stages of hardening temperature consisting of a first hardening temperature called B-stage at around 180° C. when it turns into a semi-hardened state, and a second hardening temperature called C-stage at around 290° C. when it hardens completely.

First, a transfer mold having concavities formed therein was prepared with a thermosetting type silicone resin.

The concavities corresponding to protruding electrodes were formed in the transfer mold by the imprinting method using a metal mold provided with a configuration of the protruding electrodes having 10 μm in diameter, 20 μm in height, and at regular pitches of 50 μm. The transfer mold was molded by pouring the thermosetting type silicone resin into the metal mold, and hardening it under the conditions of 150° C. in hardening temperature and for a hardening time of 30 minutes.

The concavities in the transfer mold were filled with the second conductors consisting of the two-stage curing type polyimide-base conductive resin composed mainly of the conductive filler of silver powder, up to at most a level not to reach an outer face of the concavities in a manner to leave voids therein. In this instance, an amount of the second conductors poured into the concavities was controlled by adjusting the size of meshes of a mask used for the screen printing. The second conductors were then dried at 140° C. for one minute to provide the voids in the concavities.

Next, the voids formed inside the concavities were filled with first conductors consisting of the conductive resin of heat-resistant epoxy-base polymer composed mainly of a conductive filler of silver powder having a hardening temperature of 180° C. by using the same method as the second conductors.

The transfer mold was then positioned so that the concavities filled with the first conductors and the second conductors come into alignment with wiring electrodes of a substrate.

While the wiring electrodes of the substrate and the concavities of the transfer mold were held in the aligned position, they were heated for 10 minutes at a temperature of 190° C., which is equal to the B-stage hardening temperature of the second conductors. This process formed the protruding electrodes comprised of the second conductors of the conductive resin in a semi-hardened state, while the first conductors are hardened completely at the same time.

The protruding electrodes having generally the same shape as the concavities and of an uniform height were transferred and formed on the wiring electrodes of the substrate when the transfer mold was removed.

The substrate having the protruding electrodes formed on its wiring electrodes in the above process was positioned in alignment with lead electrodes of a high heat-resistant semiconductor chip, and the semiconductor chip was heated at a temperature of 290° C., which is equal to the C-stage hardening temperature of the conductive resin of the second conductors, to make the connections between the second conductors of the protruding electrodes and the lead electrodes by fusion bonding while maintaining the conductive resin in a softened state, and finally hardened them. The conductive resin of the first conductors kept the shape without being softened during this process since it had already hardened when the protruding electrodes were formed.

Accordingly, the electronic component mounted body having the connections of excellent reliability was produced.

Description is provided in detail of certain methods of manufacturing electronic component mounted body using protruding electrodes of other configurations according to each of the following exemplary embodiments.

Fourth Exemplary Embodiment

FIG. 6A through FIG. 6F and FIG. 7A through FIG. 7F are sectional views illustrating a method of manufacturing an electronic component mounted body according to the fourth exemplary embodiment of the present invention.

Figure 6A:
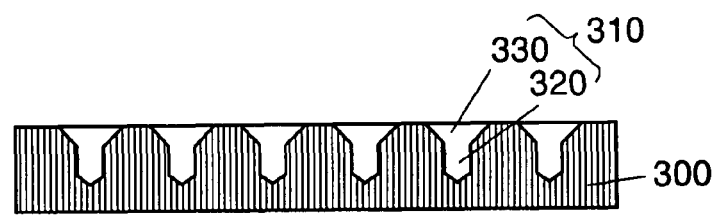
FIG. 6A is a sectional view illustrating another method of manufacturing the electronic component mounted body according to a fourth exemplary embodiment of the present invention.

Provided first is transfer mold 300 having concavities 310 formed therein to form protruding electrodes of same shape when transferred. Concavities 310 have a tiered structure consisting of two or more tiers in the longitudinally-sectioned configuration as such that it resembles a flat-head conical screw, for example, as shown in FIG. 6A. Each of concavities 310 of transfer mold 300 comprises conductor-forming cavity 320 and conductor-retaining cavity 330. In addition, transfer mold 300 is formed of a transfer mold resin such as a thermosetting type silicone resin having a low elasticity and a high mold releasability. This is because of the same reason as described in the first exemplary embodiment.

Here, concavities 310 can be formed in a transfer mold resin of transfer mold 300 by such means as imprinting method and casting method using a metal mold provided with protrusions corresponding to concavities 310 of the tiered structure having two or more tiers in the longitudinally-sectioned configuration, which resembles a flat-head conical screw, for example. More specifically, transfer mold 300 can be formed, for instance, by pouring the transfer-mold resin such as a thermosetting type silicone resin into the metal mold, and hardening it under the condition of 150° C. in temperature for 0.5 hours.

Concavities 310 in this case have 10 μm to 300 μm in diameter, 10 μm to 300 μm in height, and approximately 0.2 to 10 in the aspect ratio. In addition, a mold releasing agent such as a silicone lubricant and a fluorine lubricant may be coated at least inside of concavities 310 of transfer mold 300 to help improve the releasability.

Figure 6B:
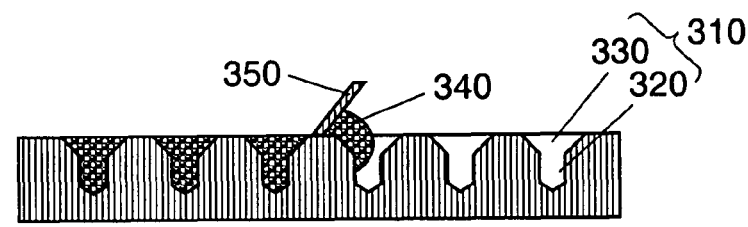
FIG. 6B is another sectional view illustrating the method of manufacturing the electronic component mounted body according to the fourth exemplary embodiment of the invention.
Figure 6C:
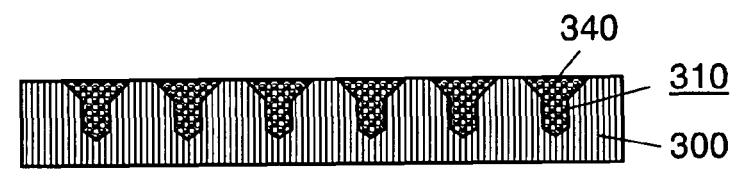
FIG. 6C is another sectional view illustrating the method of manufacturing the electronic component mounted body according to the fourth exemplary embodiment of the invention.

Next, concavities 310 of transfer mold 300 are filled with a predetermined amount of conductive material 340 composed of, for example, solder powder and pasty solder with squeegee 350 or the like means so that at least conductor-forming cavities 320 are filled with conductive material 340, as shown in FIG. 6B. This produces transfer mold 300 having concavities 310 filled with conductive material 340, as shown in FIG. 6C. Conductive material 340 can be any kind of conductive resins such as a thermosetting type polymer consisting mainly of a conductive filler.

Figure 6D:
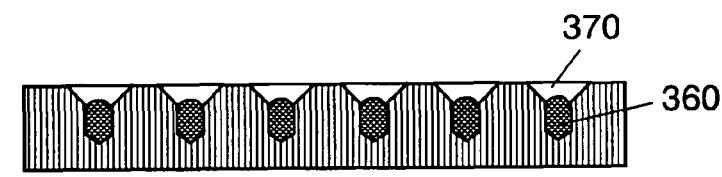
FIG. 6D is another sectional view illustrating the method of manufacturing the electronic component mounted body according to the fourth exemplary embodiment of the invention.

Next, the conductive material is heated to a temperature equal to or higher than its melting point (i.e., approximately 150° C. to 250° C.) to melt it, as shown in FIG. 6D. If it is a solder powder composed of In—Sn, for instance, it can melt when heated to about 150° C. This process forms conductors 360 having free surfaces of a hemispherical shape due to the surface tension after they have once melted in concavities 310. This process also forms voids 370 approximating conductor-retaining cavities 330 inside concavities 310 of transfer mold 300 due to contraction in the volume of the conductive material. When a conductive resin is used as the conductive material, it needs to be heated at least to its hardening temperature. In the case of a thermosetting type epoxy resin, it requires a heating temperature of 160° C. and a heating time of about 60 minutes.

Figure 6E:
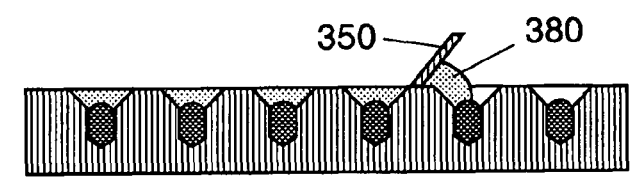
FIG. 6E is another sectional view illustrating the method of manufacturing the electronic component mounted body according to the fourth exemplary embodiment of the invention.

Next, voids 370 are filled with first insulation resin 380 with squeegee 350 or the like means, as shown in FIG. 6E. It is desirable here that first insulation resin 380 has a hardening temperature lower than the melting point or the hardening temperatures of conductors 360. A material used for first insulation resin 380 is an adhesive containing a thermosetting type resin. The thermosetting resin can be any one or a mixture of two or more materials selected from the group consisting of epoxy resin, phenolic resin, polyimide resin, polyurethane resin, melamine resin, urea resin, and the like.

Figure 6F:
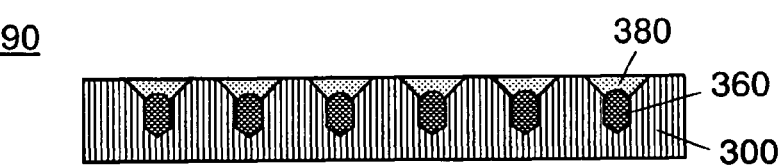
FIG. 6F is another sectional view illustrating the method of manufacturing the electronic component mounted body according to the fourth exemplary embodiment of the invention.

The above processes complete intermediate structure 390 of transfer mold 300, of which concavities 310 are filled with conductors 360 and first insulation resins 380 for retaining conductors 360, as shown in FIG. 6F.

Referring to FIG. 7A to FIG. 7F, description is provided hereinafter of the manufacturing method used subsequent to the manufacture of intermediate structure 390 of the transfer mold shown in FIG. 6F.

Figure 7A:
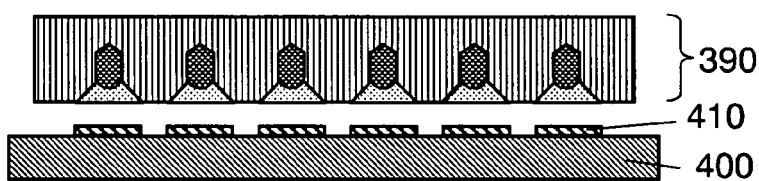
FIG. 7A is another sectional view illustrating the method of manufacturing the electronic component mounted body according to the fourth exemplary embodiment of the invention.

First, the surface of concavities 310 of intermediate structure 390 of the transfer mold is aligned to face with a plurality of wiring electrodes 410 formed on wiring substrate 400, as shown in FIG. 7A.

Figure 7B:
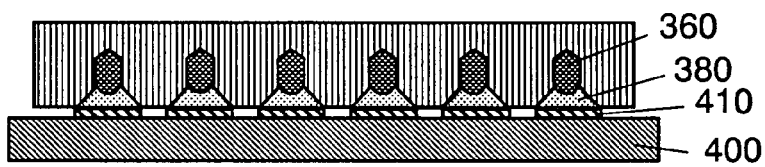
FIG. 7B is another sectional view illustrating the method of manufacturing the electronic component mounted body according to the fourth exemplary embodiment of the invention.

Next, intermediate structure 390 of the transfer mold is placed in a manner to confront wiring electrodes 410 of wiring substrate 400, as shown in FIG. 7B. While they are held in this position, they are heated at a temperature not exceeding the hardening temperature of first insulation resin 380 to bring it into a semi-hardened state. If first insulation resin 380 is an epoxy resin, for instance, it is heated at a heating temperature of 120° C. for a heating time of about 60 minutes. Although these conditions vary depending on the material used for first insulation resin 380, it is desirable that the temperature do not exceed both the hardening temperature of first insulation resin 380 and the melting point of conductors 360. Here, the semi-hardened state of first insulation resin 380 can be so defined that it has an enough strength of bonding to wiring electrodes 410 for transferring conductors 360 and first insulation resin 380 when transfer mold 300 is removed.

Figure 7C:
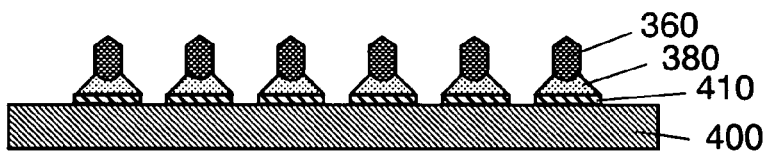
FIG. 7C is another sectional view illustrating the method of manufacturing the electronic component mounted body according to the fourth exemplary embodiment of the invention.

As shown in FIG. 7C, the protruding electrodes comprising conductors 360 retained by semi-hardened first insulation resin 380 are transferred to wiring electrodes 410 of wiring substrate 400 when transfer mold 300 is removed.

Figure 7D:
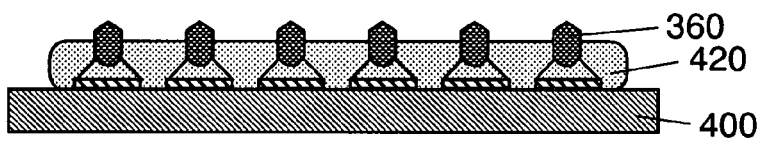
FIG. 7D is another sectional view illustrating the method of manufacturing the electronic component mounted body according to the fourth exemplary embodiment of the invention.

Next, second insulation resin 420 is formed on wiring electrodes 410 of wiring substrate 400, on which the protruding electrodes having conductors 360 retained by semi-hardened first insulation resin 380 are transferred, as shown in FIG. 7D. It is desirable to form second insulation resin 420 into a thickness at least equivalent to the height of conductors 360. This is because second insulation resin 420 cannot be used as an under-filling material for bonding the semiconductor chip and the wiring substrate when, for instance, it is thinner than the height of conductors 360. A material suitable for second insulation resin 420 includes an adhesive containing thermosetting type resin such as one similar to first insulation resin 380. The thermosetting resin can be any one or a mixture of two or more materials selected from the group consisting of epoxy resin, phenolic resin, polyimide resin, polyurethane resin, melamine resin, urea resin, and the like.

Figure 7E:
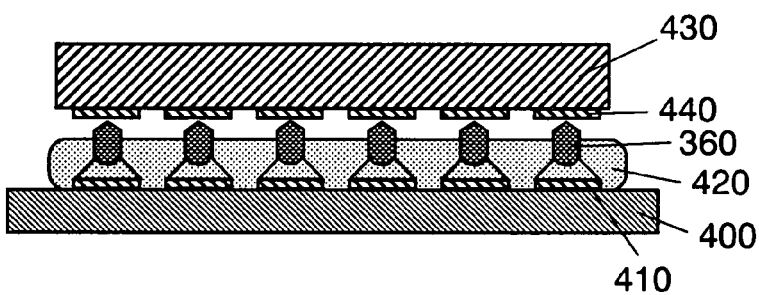
FIG. 7E is still another sectional view illustrating the method of manufacturing the electronic component mounted body according to the fourth exemplary embodiment of the invention.

Next, electronic component 430 such as a semiconductor chip provided with a plurality of lead electrodes 440 is brought into alignment with and positioned over conductors 360 retained on wiring electrodes 410 of wiring substrate 400, as shown in FIG. 7E. Electronic component 430 and wiring substrate 400 are then compressed in a manner to make connections between lead electrodes 440 and wiring electrodes 410 by means of pressure welding or crimp-on bonding through conductors 360 of the protruding electrodes. Since the tips of conductors 360 are conically or hemispherically shaped, they can be connected to wiring electrodes 410 or lead electrodes 440, for instance, with a small pressure during this process. The tips of this shape also help achieve stable connections since they can get into embedment in wiring electrodes 410 or lead electrodes 440 due to concentration of the pressure at the tips of conductors 360.

Figure 7F:
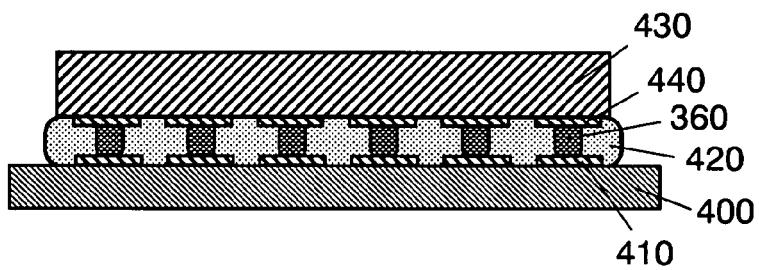
FIG. 7F is yet another sectional view illustrating the method of manufacturing the electronic component mounted body according to the fourth exemplary embodiment of the invention.

While lead electrodes 440 of electronic component 430 and wiring electrodes 410 of wiring substrate 400 are pressure-welded through conductors 360, as shown in FIG. 7F, they are heated at a temperature equal to or higher than the hardening temperatures of the first insulation resin and the second insulation resin to harden them. The above processes thus produced electronic component mounted body 450 having electrically connected electronic component 430 and wiring substrate 400.

According to the fourth exemplary embodiment of the present invention, the electronic component mounted body having finely pitched connections can be made easily since the protruding electrodes comprised of the conductors can be transferred while being fixed temporarily with the semi-hardened first insulation resin. In addition, the processes can also make the conductors of the uniform shape since they are formed by melting the solder powder inside the concavities of the transfer mold. Moreover, the shape of the conductors can be designed freely by way of configuring the concavities of the transfer mold. Therefore, when the tips of the conductors are conically shaped, for example, they enable the connections with a small pressure, and substantially reduce the possibility of causing cracks in the electronic component during the pressure welding.

In the fourth exemplary embodiment of this invention, although what has been described represents examples of using different resin materials between the first insulation resins and the second insulation resins, the scope of this invention is not limited to these examples. Both the first insulation resins and the second insulation resins can be of the same material, for instance. When this is the case, the productivity can be improved since consideration is not required on differences of the adhesions, hardening temperatures and the like in the processes of manufacturing.

In the fourth exemplary embodiment of this invention, the concavities of the transfer mold for the protruding electrodes are illustrated by taking an example of the tiered configuration having two or more tiers similar to that of a flat-head conical screw. However, the scope of this invention is not limited to this example. The concavities may be of any shape such as a cone or a pyramid without any specific limitation so long as the shape is suitable for molding a plurality of the conductors uniformly.

Description is provided hereinafter of another method of manufacturing electronic component mounted body according to the fourth exemplary embodiment of this invention with reference to FIG. 8A to FIG. 8F.

The method shown in FIG. 8A to FIG. 8F differs from the previous method of this fourth exemplary embodiment in the aspect that this method is for transferring protruding electrodes having conductors to lead electrodes of an electronic component, instead of the processes shown after FIG. 6F. Description of the other processes will be skipped since they are analogous to those in FIG. 6A to FIG. 6F.

Figure 8A:
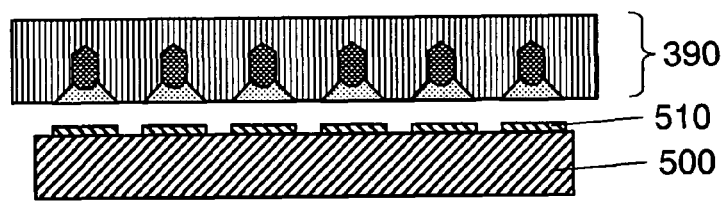
FIG. 8A is a sectional view illustrating an other example of the method of manufacturing the electronic component mounted body according to the fourth exemplary embodiment of the invention.

That is, concavity-side surface of intermediate structure 390 of the transfer mold shown in FIG. 6F and a plurality of lead electrodes 510 formed on electronic component 500 such as semiconductor chip are positioned in alignment to each other, as shown in FIG. 8A.

Figure 8B:
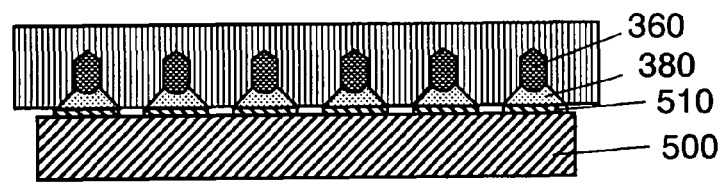
FIG. 8B is another sectional view illustrating the other example of the method of manufacturing the electronic component mounted body according to the fourth exemplary embodiment of the invention.

Next, intermediate structure 390 of the transfer mold is placed on electronic component 500 in a manner that the concavity-side surface confronts lead electrodes 510, as shown in FIG. 8B. They are then heated in this condition at a temperature not exceeding the hardening temperature of first insulation resin 380 to bring it into a semi-hardened state. If first insulation resin 380 is formed of an epoxy resin, for instance, it is heated at a heating temperature of 120° C. for a heating time of about 60 minutes.

Figure 8C:
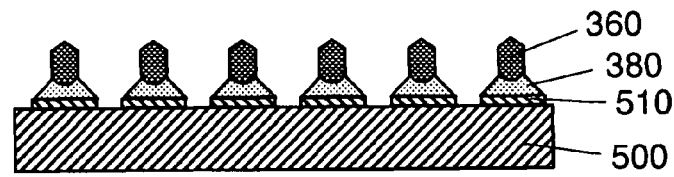
FIG. 8C is another sectional view illustrating the other example of the method of manufacturing the electronic component mounted body according to the fourth exemplary embodiment of the invention.

Conductors 360 retained by semi-hardened first insulation resin 380 are transferred to lead electrodes 510 of electronic component 500, as shown in FIG. 8C, when the transfer mold is removed.

Figure 8D:
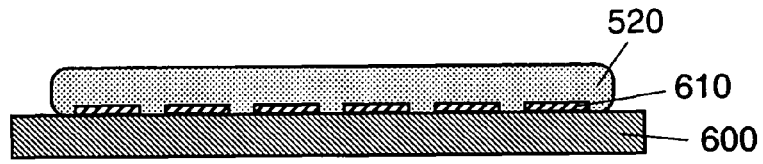
FIG. 8D is another sectional view illustrating the other example of the method of manufacturing the electronic component mounted body according to the fourth exemplary embodiment of the invention.

Next, second insulation resin 520 is formed on wiring electrodes 610 of wiring substrate 600 as shown in FIG. 8D.

Figure 8E:
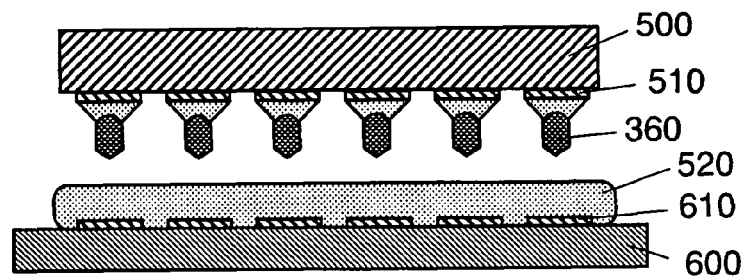
FIG. 8E is still another sectional view illustrating the other example of the method of manufacturing the electronic component mounted body according to the fourth exemplary embodiment of the invention.

Next, electronic component 500 is positioned on wiring substrate 600 provided with a plurality of wiring electrodes 610 in a manner that the protruding electrodes having conductors 360 retained on lead electrodes 510 are in alignment with wiring electrodes 610 of wiring substrate 600 through second insulation resin 520, as shown in FIG. 8E. Electronic component 500 and wiring substrate 600 are then compressed so as to make connections between lead electrodes 510 and wiring electrodes 610 by means of pressure welding or crimp-on bonding through conductors 360. Since the tips of conductors 360 are conically or hemispherically shaped, they can be connected to wiring electrodes 610 or lead electrodes 510, for instance, with a small pressure during this process. Because of concentration of the pressure at the tips of conductors 360, the tips also help establish the connections as they are embedded into wiring electrodes 610 or lead electrodes 510.

Figure 8F:
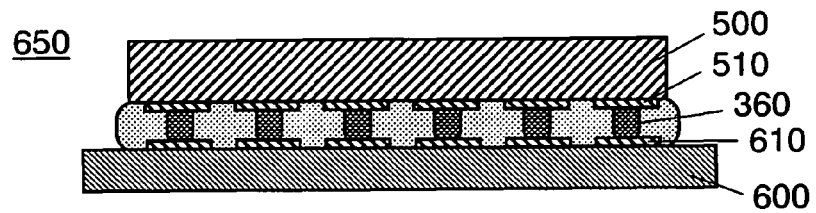
FIG. 8F is yet another sectional view illustrating the other example of the method of manufacturing the electronic component mounted body according to the fourth exemplary embodiment of the invention.

While lead electrodes 510 of electronic component 500 and wiring electrodes 610 of wiring substrate 600 are pressure-welded through conductors 360, as shown in FIG. 8F, they are heated at a temperature equal to or higher than the hardening temperatures of the first insulation resin and the second insulation resin to harden them. The above processes thus produced electronic component mounted body 650 having electrically connected electronic component 500 and wiring substrate 600.

This example of the fourth exemplary embodiment provides the same advantages as the previous method discussed in this fourth exemplary embodiment of the invention.

Fifth Exemplary Embodiment

Description is provided hereinafter of a method of manufacturing electronic component mounted body according to the fifth exemplary embodiment with reference to FIG. 9A to FIG. 9D.

The manufacturing method shown in FIG. 9A to FIG. 9D differs in the process of forming the second insulation resin from the process discussed after FIG. 7C of the fourth exemplary embodiment. Description of the other processes will be skipped since they are analogous to those of the fourth exemplary embodiment.

Figure 9A:
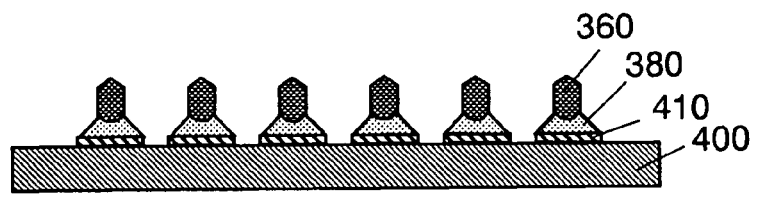
FIG. 9A is a sectional view illustrating a method of manufacturing the electronic component mounted body according to a fifth exemplary embodiment of the present invention.

That is, wiring substrate 400 having protruding electrodes comprised of conductors 360 retained by semi-hardened first insulation resin 380 on wiring electrodes 410 is prepared, as shown in FIG. 9A. This wiring substrate 400 is identical to the one shown in FIG. 7C, as prepared for electronic component mounted body 450 formed according to the manufacturing method of the fourth exemplary embodiment.

Figure 9B:
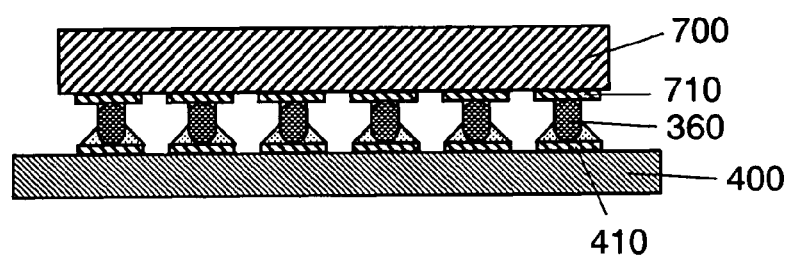
FIG. 9B is another sectional view illustrating the method of manufacturing the electronic component mounted body according to the fifth exemplary embodiment of the invention.

Next, electronic component 700 provided with lead electrodes 710 is brought into alignment with and positioned over conductors 360, as shown in FIG. 9B. Electronic component 700 and wiring substrate 400 are then compressed in a manner to make connections between lead electrodes 710 and wiring electrodes 410 by means of pressure welding or crimp-on bonding through conductors 360. Since the tips of conductors 360 are conically or hemispherically shaped, they can be connected to wiring electrodes 910 or lead electrodes 710, for instance, with a small pressure during this process. In addition, the tips of this shape also help achieve stable connections since they can get into embedment in wiring electrodes 410 or lead electrodes 710 due to concentration of the pressure at the tips of conductors 360.

Figure 9C:
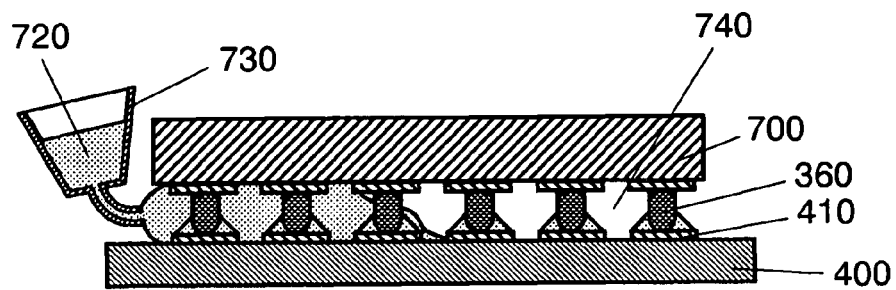
FIG. 9C is another sectional view illustrating the method of manufacturing the electronic component mounted body according to the fifth exemplary embodiment of the invention.

Next, second insulation resin 720 is injected from the exterior side of electronic component 700, for instance, into space 740 by using injection device 730 such as a dispenser, as shown in FIG. 9C, while maintaining conductors 360 embedded, for example, into wiring electrodes 410 of wiring substrate 400 or lead electrodes 710 of electronic component 700. Here, space 740 is a gap formed by conductors 360 across electronic component 700 and wiring substrate 400. Second insulation resin 720 may be injected by alternative means of the capillary action, or by decompressing the space other than the injecting side.

Upon completion of the injection, first insulation resin 380 and second insulation resin 720 are hardened by heating them at a temperature equal to or higher than the hardening temperatures of the both resins. If first insulation resin 380 and second insulation resin 720 are epoxy resins, for instance, they are heated at a heating temperature of 160° C. for a heating time of about 60 minutes.

Figure 9D:
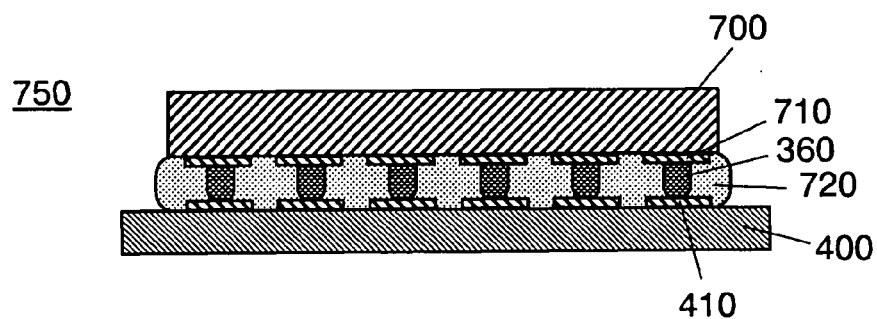
FIG. 9D is another sectional view illustrating the method of manufacturing the electronic component mounted body according to the fifth exemplary embodiment of the invention.

The above processes thus produced electronic component mounted body 750 comprising electronic component 700 and wiring substrate 400, which are connected electrically with protruding electrodes having conductors 360, as shown in FIG. 9D.

Description is provided hereinafter of another method of manufacturing electronic component mounted body according to the fifth exemplary embodiment of this invention with reference to FIG. 10A to FIG. 10D.

In FIG. 10A to FIG. 10D, this method differs from the previous method of this fifth exemplary embodiment in the aspect that the protruding electrodes having conductors 360 retained by first insulation resin 380 are formed on lead electrodes 510 of electronic component 500. Description of the other processes will be skipped since they are analogous to those shown in FIG. 9A to FIG. 9D.

According to this and the other examples of the fifth exemplary embodiment of the present invention, the lead electrodes of the electronic component or the wiring electrodes of the wiring substrate are connected directly by the pressure welding without intervention of the second insulation resin. This embodiment is thus capable of making electronic component mounted body 750 while achieving a further improvement in reliability of the connections.

Sixth Exemplary Embodiment

Description is provided hereinafter of a method of manufacturing electronic component mounted body according to the sixth exemplary embodiment with reference to FIG. 11A to FIG. 11D.

In FIG. 11A to FIG. 11D, this method differs from that of the fourth exemplary embodiment in the aspect that lead electrodes of the electronic component and wiring electrodes of the wiring substrate are connected by re-melting protruding electrodes while being subjected to a pressure.

Figure 11A:
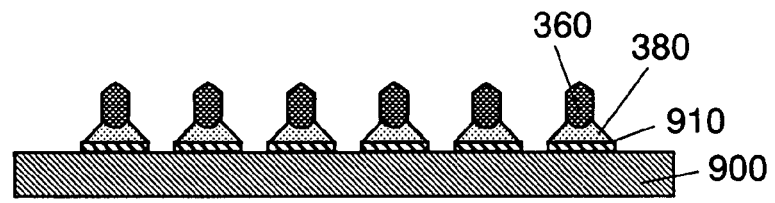
FIG. 11A is a sectional view illustrating a method of manufacturing the electronic component mounted body according to a sixth exemplary embodiment of the present invention.
Figure 11B:
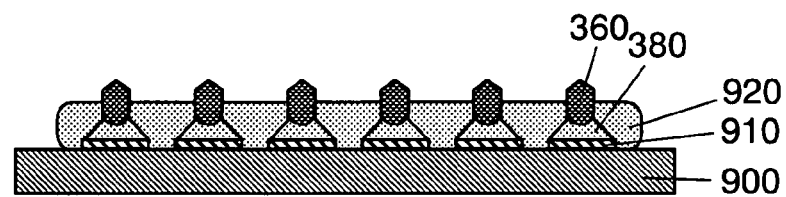
FIG. 11B is another sectional view illustrating the method of manufacturing the electronic component mounted body according to the sixth exemplary embodiment of the invention.

That is, wiring substrate 900 having protruding electrodes comprised of conductors 360 retained by semi-hardened first insulation resin 380 on wiring electrodes 910 is prepared, as shown in FIG. 11A. This wiring substrate 900 is similar to the one shown in FIG. 7C, as prepared according to the manufacturing method of the fourth exemplary embodiment.

Next, second insulation resin 920 is formed on wiring electrodes 910 of wiring substrate 900, on which the protruding electrodes having conductors 360 retained by semi-hardened first insulation resin 380 is transferred, as shown in FIG.

11B. It is desirable to form second insulation resin 920 into a thickness at least equivalent to the height of conductors 360. This is because second insulation resin 920 cannot fulfill its function as an under-filling material of a semiconductor chip, for instance, if it is thinner than the height of conductors 360. A material suitable for second insulation resin 420 includes an adhesive containing thermosetting type resin such as one similar to first insulation resin 380. The thermosetting resin can be any one or a mixture of two or more materials selected from the group consisting of epoxy resin, phenolic resin, polyimide resin, polyurethane resin, melamine resin, urea resin, and the like.

Figure 11C:
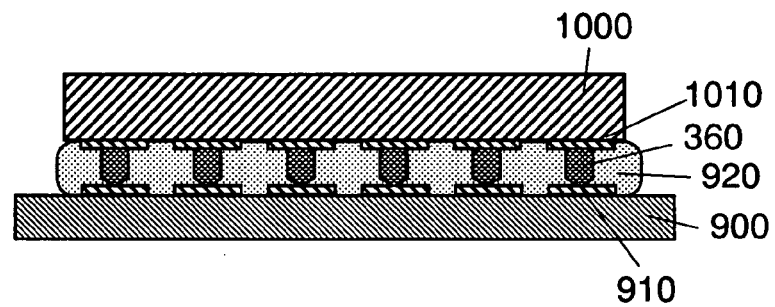
FIG. 11C is another sectional view illustrating the method of manufacturing the electronic component mounted body according to the sixth exemplary embodiment of the invention.
Figure 11D:
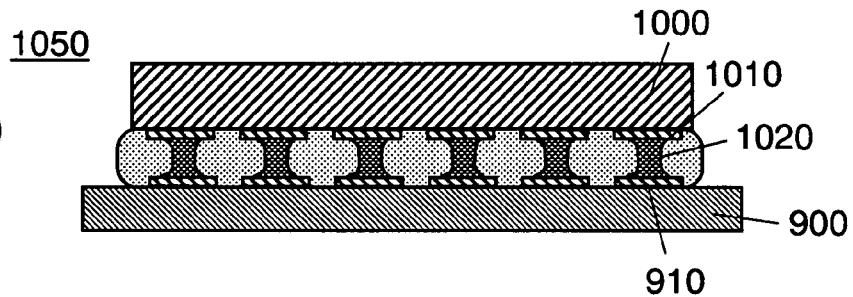
FIG. 11D is another sectional view illustrating the method of manufacturing the electronic component mounted body according to the sixth exemplary embodiment of the invention.

Next, electronic component 1000 such as a semiconductor chip provided with a plurality of lead electrodes 1010 is brought into alignment with and positioned over conductors 360 retained on wiring electrodes 910 of wiring substrate 900, as shown in FIG. 11C. Electronic component 1000 and wiring substrate 900 are then compressed in a manner to make connections between lead electrodes 1010 and wiring electrodes 910 through conductors 360. Since the tips of conductors 360 are conically or hemispherically shaped, they can be connected to wiring electrodes 910 or lead electrodes 1010, for instance, with a small pressure during this process. The tips of this shape also enable them to establish connections by being embedded into wiring electrodes 910 or lead electrodes 1010 due to concentration of the pressure at the tips of conductors 360. However, the tips of conductors 360 are not necessarily embedded in the case of the sixth exemplary embodiment because conductors 360 are re-melted when making the electrical connections.

Lead electrodes 1010 of electronic component 1000 and wiring electrodes 910 of wiring substrate 900 are held in contact with each other through conductors 360 with a space kept therebetween, as shown in FIG. 11, and they are heated at a temperature equal to or higher than the hardening temperatures of the first insulation resin and the second insulation resin as well as the melting point of the conductors. This process causes conductors 360 composed of a solder for instance, to spread because of the high wettability with the lead electrodes of the electronic component and the wiring electrodes of the wiring substrate. This process also produces conductive layers 1020 of a drum-like shape since there is a fixed space between the electronic component and the wiring substrate. Electronic component mounted body 1050 comprising the rigidly fixed electronic component and wiring substrate is completed at the same time, as the first insulation resin and the second insulation resin are hardened in the process.

There is no specific limitation on the relation between the melting point of the conductors and the hardening temperatures of the first insulation resin and the second insulation resin. However, it is desirable that the melting point of the conductors is lower than the hardening temperatures of the first insulation resin and the second insulation resin when forming the conductive layers of the drum-like shape. This is because the conductors are unable to spread over the terminal surfaces even after melted if the first insulation resin and the second insulation resin have hardened.

According to the sixth exemplary embodiment of this invention, the connections can be made positively by the conductive layers between the lead electrodes of the electronic component and the wiring electrodes of the wiring substrate.

In addition, the connections can be made with a small force when applying a pressure for the pressure welding between the conductors and the wiring electrodes since the conductors are melted during the connections. This achieves the electronic component mounted body of excellent reliability with the electronic component not likely to be cracked or otherwise damaged.

Description is provided hereinafter of another method of manufacturing electronic component mounted body according to the sixth exemplary embodiment of this invention with reference to FIG. 12A to FIG. 12D.

In FIG. 12A to FIG. 12D, this method differs in the process of forming the second insulation resin from that of the previous method of this sixth exemplary embodiment.

Figure 12A:
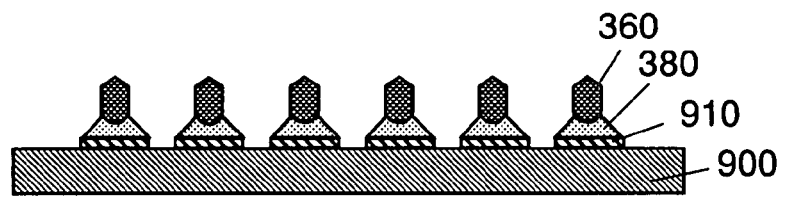
FIG. 12A is a sectional view illustrating an other example of the method of manufacturing the electronic component mounted body according to the sixth exemplary embodiment of the invention.

That is, wiring substrate 900 having conductors 360 retained by semi-hardened first insulation resin 380 on wiring electrodes 910 is prepared, as shown in FIG. 12A. This wiring substrate 900 is same as the one shown in FIG. 7C, as prepared according to the manufacturing method of the fourth exemplary embodiment.

Figure 12B:
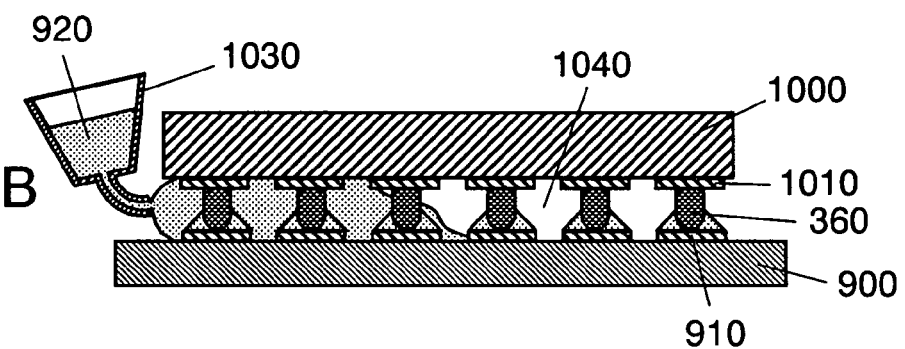
FIG. 12B is another sectional view illustrating the other example of the method of manufacturing the electronic component mounted body according to the sixth exemplary embodiment of the invention.

Next, electronic component 1000 provided with lead electrodes 1010 is brought into alignment with and positioned in a manner to confront conductors 360, as shown in FIG. 12B. Electronic component 1000 and wiring substrate 900 are then pressed to make connections between lead electrodes 1010 and wiring electrodes 910 through conductors 360.

Figure 12C:
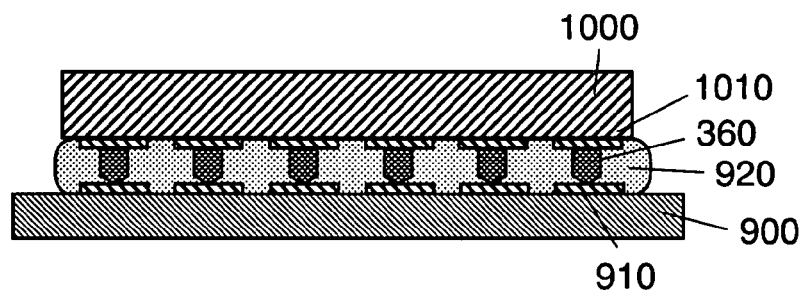
FIG. 12C is still another sectional view illustrating the other example of the method of manufacturing the electronic component mounted body according to the sixth exemplary embodiment of the invention.

While wiring electrodes 910 of wiring substrate 900 and lead electrodes 1010 of electronic component 1000 are held in contact with each other through conductors 360, second insulation resin 920 is injected into space 1040 by using injection device 1030 such as a dispenser. Here, space 1040 is a gap formed by conductors 360 across electronic component 1000 and wiring substrate 900. Second insulation resin 920 may be injected by alternative means of the capillary action, or by decompressing the space other than the injecting side. This process makes electronic component 1000 and wiring substrate 900 in a state of being connected through conductors 360 by second insulation resin 920, as shown in FIG. 12C.

Figure 12D:
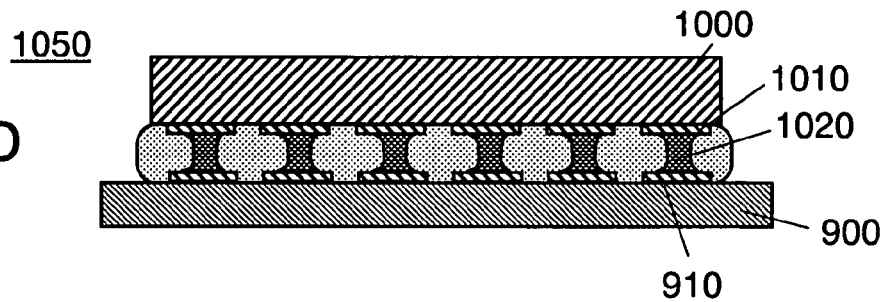
FIG. 12D is yet another sectional view illustrating the other example of the method of manufacturing the electronic component mounted body according to the sixth exemplary embodiment of the invention.

Lead electrodes 1010 of electronic component 1000 and wiring electrodes 910 of wiring substrate 900 are held in contact with each other through conductors 360 with a space kept therebetween, as shown in FIG. 12D, and they are heated at a temperature equal to or higher than the hardening temperatures of the first insulation resin and the second insulation resin as well as the melting point of the conductors. This process causes the conductors composed of a solder for instance, to spread because of its high wettability with lead electrodes 1010 of electronic component 100 and wiring electrodes 910 of wiring substrate 900. This process also produces conductive layers 1020 of a drum-like shape if the wettability of the solder with the respective terminals exceeds its surface tension since there is a fixed space between electronic component 1000 and wiring substrate 900. Electronic component mounted body 1050 comprising the rigidly fixed electronic component 1000 and wiring substrate 900 is completed at the same time, as the first insulation resin and the second insulation resin are hardened in the process.

It is desirable here that at least one of the first insulation resin and the second insulation resin contains flux or the like agent to further improve the wettability with the individual terminals when the conductors such as the solder are re-melted.

This example of the sixth exemplary embodiment provides the like advantages as the previous method in this sixth exemplary embodiment of the invention. In addition, since the lead electrodes of the electronic component or the wiring electrodes of the wiring substrate are connected directly to the conductors by the pressure welding, there is no intervention of the second insulation resin. This embodiment is thus capable of making the electronic component mounted body of excellent reliability provided with a small variation in the contact resistances with stable connections.

In the first through the sixth exemplary embodiments discussed above, although what have been described are examples of forming the protruding electrodes on the wiring electrodes or the lead electrodes by using the transfer mold, the scope of this invention is not limited to these examples. Wiring traces may be formed by overlaying conductors on an insulation resin, or protruding electrodes may be formed additionally on parts of the conductors with a transfer mold, for example, as will be discussed in the following exemplary embodiments.

In other words, in the case of wiring traces heretofore formed by means of the screen printing method, for instance, with conductive paste for connecting electronic components and wiring substrates of low resistances to heat, it is difficult to reduce their electrical resistances because of low conductivities attributed to the intervention of resin elements such as binders in the conductive fillers.

Furthermore, when wiring traces are formed with a conductive paste on a wiring substrate, it is necessary to optimize the mixing ratio of a binder and a conductive filler and to ensure the liquidity in order to improve the printing quality. This makes it difficult, on the contrary, to keep a shape of the wiring traces after the screen printing, especially at the edges of the wiring traces, where the conductive paste tends to run down. The phenomenon of running down extends further when the conductive paste is being hardened at a temperature of about 150° C., for instance, after formation of the wiring traces, which thus stands in the way of forming fine wiring traces. These embodiments provide an advantageous effect to overcome the above problems.

Accordingly, description is provided hereinafter of a wiring substrate having wiring traces formed by overlaying conductors with an insulation resin, and a method of manufacturing the same. Also described is a method of manufacturing an electronic component mounted body provided with protruding electrodes formed on parts of the conductors of the wiring traces.

Seventh Exemplary Embodiment

Figure 13A:
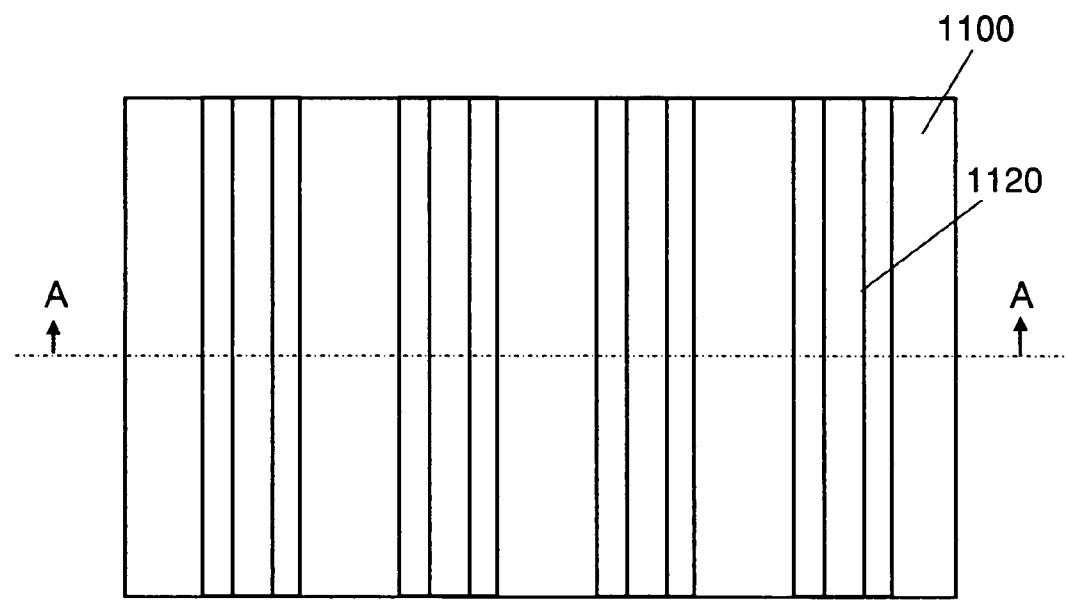
FIG. 13A is a plan view of a wiring substrate according to a seventh exemplary embodiment of the present invention.
Figure 13B:
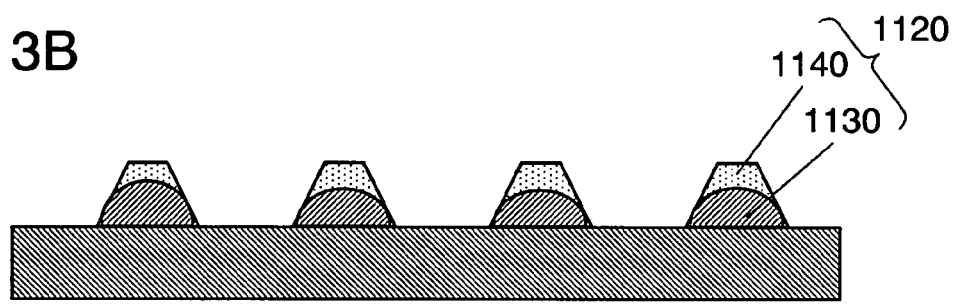
FIG. 13B is a sectional view taken along the line A-A in FIG. 13A.

FIG. 13A is a plan view of a wiring substrate according to the seventh exemplary embodiment of the present invention, and FIG. 13B is a sectional view taken along the line A-A in FIG. 13A.

In FIG. 13A, wiring traces 1120 are formed on substrate 1100 composed of a resin substrate made of such material as PET. Wiring traces 1120 consist of insulation resins 1130 on the surface of substrate 1100, and conductors 1140 overlaid thereon, as shown in FIG. 13B. Wiring traces 1120 can be formed in fine pitches, a high aspect ratio and of an uniform height since they are molded with a transfer mold having concavities, as will be described in the following manufacturing method.

Here, materials suitable for substrate 1100 include a glass epoxy substrate made of a glass cloth impregnated with an epoxy resin, flexible substrates made of such materials as PET ("polyethylene terephthalate") resin and polyimide resin, and inorganic substrates such as ceramic.

Materials suitable for insulation resin 1130 includes an adhesive containing thermosetting type resin, for example. The thermosetting resin can be any one or a mixture of two or more materials selected from the group consisting of epoxy resin, phenolic resin, polyimide resin, polyurethane resin, melamine resin, urea resin, and the like. The epoxy resin is especially desirable in view of its properties of improving viscosity and hardening reaction of the conductive resin, and a strength of bonding to substrate 1100.

Conductors 1140 can be made of a conductive resin composed of 75 pts.wt. to 95 pts.wt. of conductive filler and 5 pts.wt. to 25 pts.wt. of thermosetting type resin, or a solder material, for example. Some examples of materials used as the conductive filler are metal powder of silver, copper, gold, nickel, palladium, tin and the like, and alloy of these metals. The thermosetting resin can be any one or a mixture of two or more materials selected from the group consisting of epoxy resin, phenolic resin, polyimide resin, polyurethane resin, melamine resin, urea resin, and the like. A thermosetting type resin of the same kind as insulation resin 1130 is especially desirable here in the viewpoint of improving the bonding strength to conductors 1140.

The solder material can be any of the general purpose type solder. When a resin substrate such as PET ("polyethylene terephthalate") is used for substrate 1100, however, it is desirable to use a solder of low melting point such as a lead-free solder composed of indium (In)-tin (Sn) or bismuth (Bi)-tin (Sn) having a melting point not higher than 150° C.

As a result of the above, the adhesion of insulation resin 1130 can substantially improve the bonding strength between substrate 1100 and conductors 1140. The above can therefore achieve the wiring substrate of excellent flexibility and high reliability since separation of wiring traces 1120 from substrate 1100 is not likely even if substrate 1100 undergoes thermal stresses, external impacts, deformation and the like.

It is also possible to increase a content of the conductive filler by selecting a material of high adhesion to insulation resin 1130, even when a conductive resin is used to compose conductors 1140. The result is an increase in the electric conductivity of wiring traces 1120, which realizes the wiring substrate provided with wiring traces 1120 of low line resistances.

Referring to FIG. 14A to FIG. 14F, description is provided of a method of manufacturing the wiring substrate of the seventh exemplary embodiment of this invention.

FIG. 14A to FIG. 14F are sectional views illustrating the method of manufacturing the wiring substrate according to the seventh exemplary embodiment of this invention.

Figure 14A:
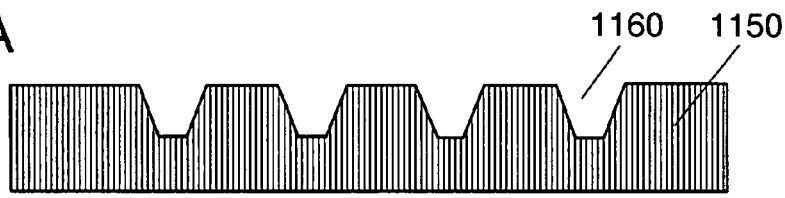
FIG. 14A is a sectional view illustrating a method of manufacturing the wiring substrate according to the seventh exemplary embodiment of the present invention.

Provided first is transfer mold 1150 having concavities 1160 formed in the positions corresponding to where wiring traces are formed, as shown in FIG. 14A. Transfer mold 1150 used here is made of a transfer mold resin such as a thermosetting type silicone resin having a low elasticity and high mold releasing property. One of the reasons is that silicone resin exhibits an excellent mold releasing property to conductive resins and solder materials. A second reason is of its low elasticity, which facilitates removal of wiring traces without causing any damages in their shapes when being transferred even when the concavities have a complicated configuration. Still another reason is of its feature of deformability corresponding to a shape of the substrate, even if irregularly warped, so as to make the wiring traces easily transferable to the substrate.

Concavities 1160 corresponding to the wiring traces are formed in transfer mold 1150 made of a transfer mold resin by such a method as imprinting or intaglio printing by using a metal mold provided with a configuration of the wiring traces having 5 μm to 300 μm in width, 5 μm to 300 μm in thickness, and approximately 0.2 to 2.0 in the aspect ratio, for example. The transfer mold can be formed, for instance, by pouring the transfer-mold resin such as a thermosetting type silicone resin into the metal mold, and hardening it under the condition of 150° C. in temperature for 0.5 hours. In addition, a mold releasing agent such as a silicone lubricant and a fluorine lubricant may be coated at least inside concavities 1160 of transfer mold 1150 to help improve the releasability.

Figure 14B:
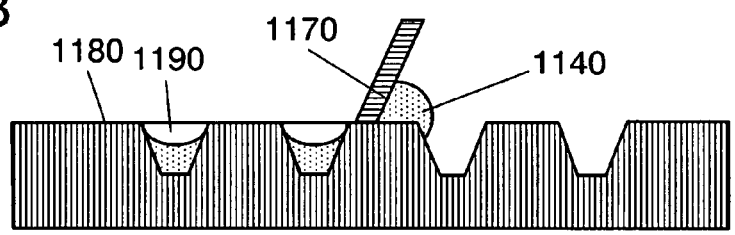
FIG. 14B is another sectional view illustrating the method of manufacturing the wiring substrate according to the seventh exemplary embodiment of the invention.

Next, concavities 1160 of transfer mold 1150 are filled with conductors 1140 consisting of a pasty conductive resin composed mainly of silver or a solder material, for instance, up to at most a level not to reach outer face 1180 of concavities 1160 so as to leave voids 1190 therein, as shown in FIG. 14B. In this instance, an amount of conductors 1140 poured in concavities 1160 can be controlled by adjusting the size of meshes of a mask used for screen printing or a speed of squeegee 1170, for instance. Alternatively, voids 1190 may be formed by filling concavities 1160 with conductors 1140 up to an even level with outer face 1180 of concavities 1160, and drying them with natural air or at any temperatures below the hardening point or the melting point. Or, voids 1190 may also be formed by pressing conductors 1140 forcibly into concavities 1160 with a roller made of a material having a weak adhesive to conductors 1140 (e.g., fluorocarbon resin, etc.).

Figure 14C:
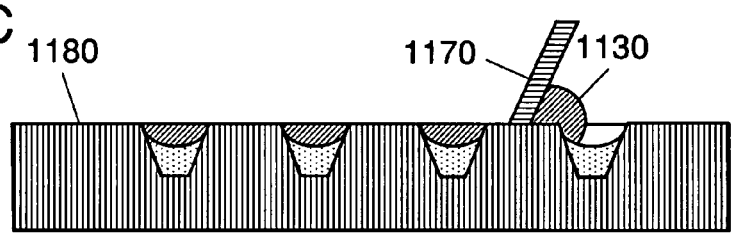
FIG. 14C is another sectional view illustrating the method of manufacturing the wiring substrate according to the seventh exemplary embodiment of the invention.

Next, voids 1190 formed inside concavities 1160 are filled with insulation resin 1130 composed of an epoxy resin, for instance, by using the method similar to conductors 1140, as shown in FIG. 14C.

Figure 14D:
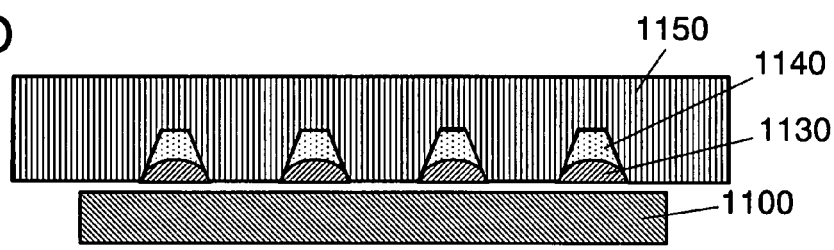
FIG. 14D is another sectional view illustrating the method of manufacturing the wiring substrate according to the seventh exemplary embodiment of the invention.

Transfer mold 1150 having its concavities filled with insulation resin 1130 and conductors 1140 is then positioned in alignment with substrate 1100, as shown in FIG. 14D.

Figure 14E:
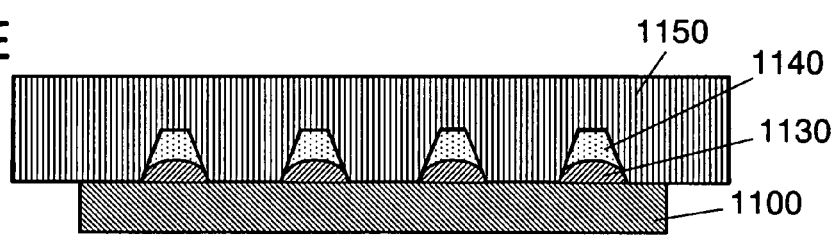
FIG. 14E is still another sectional view illustrating the method of manufacturing the wiring substrate according to the seventh exemplary embodiment of the invention.

While substrate 1100 and transfer mold 1150 are held in close contact to each other in their aligned position, as shown in FIG. 14E, insulation resin 1130 and conductors 1140 are hardened by heating them at a temperature higher than their hardening temperatures. If insulation resin 1130 and conductors 1140 contain an epoxy resin, for instance, they are hardened at a temperature of 150° C. for a hardening time of about 60 minutes. It is necessary in this case that the materials are of such a combination that insulation resin 1130 has a lower hardening temperature than the hardening temperature or the melting point of conductors 1140. If insulation resin 1130 and conductors 1140 do not mix or melt with each other, however, the hardening temperature of insulation resin 1130 can be higher than that of conductors 1140. It is desirable to select the materials of such combination that both insulation resin 1130 and conductors 1140 melt or diffuse each other only in the vicinities of their interfaces at the condition of their hardening temperatures so as to further improve the adhesion.

This process hardens the wiring traces on substrate 1100 in the same configuration as that of the concavities of transfer mold 1150.

Figure 14F:
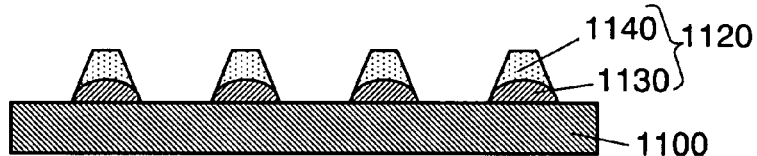
FIG. 14F is yet another sectional view illustrating the method of manufacturing the wiring substrate according to the seventh exemplary embodiment of the invention.

Accordingly, wiring traces 1120 having generally the same configuration as the concavities and of an uniform height are transferred and formed on substrate 1100, as shown in FIG. 14F, when the transfer mold is removed.

Eighth Exemplary Embodiment

Figure 15A:
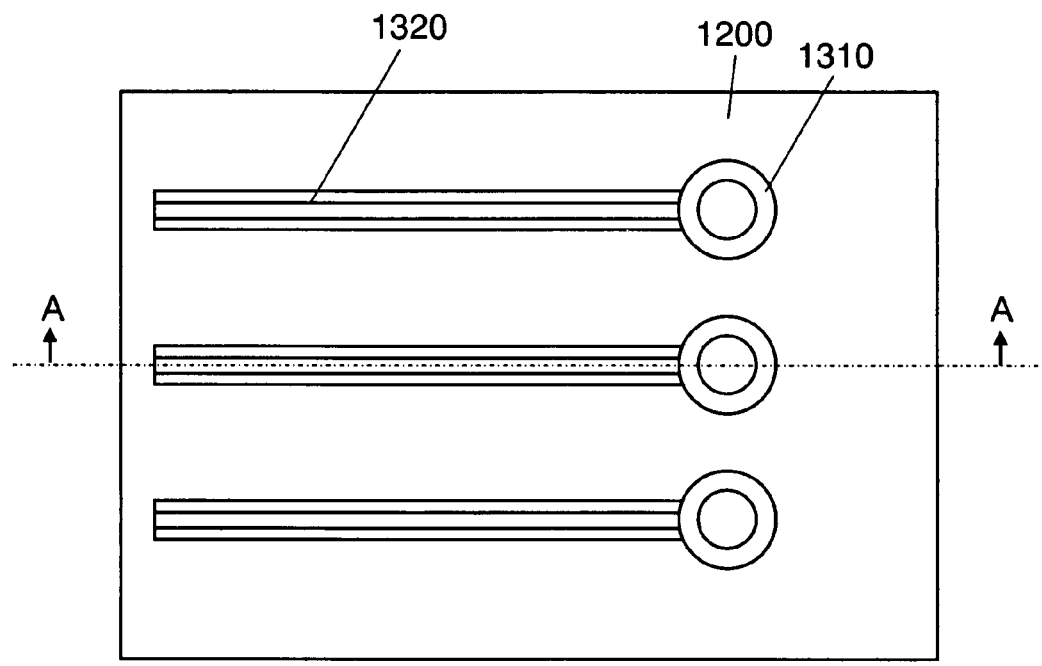
FIG. 15A is a plan view of a wiring substrate according to an eighth exemplary embodiment of the present invention.
Figure 15B:
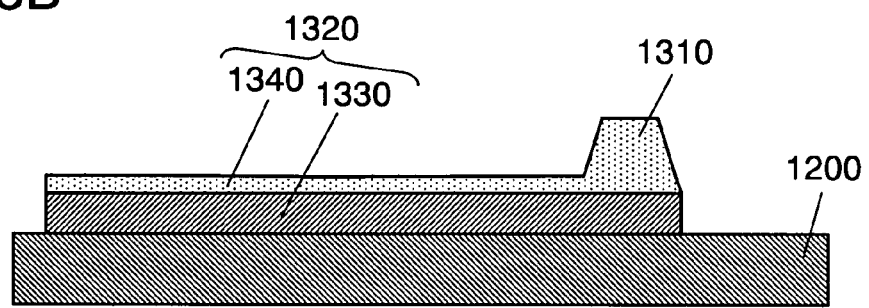
FIG. 15B is a sectional view taken along the line A-A in FIG. 15A.

FIG. 15A is a plan view of a wiring substrate according to the eighth exemplary embodiment of the present invention, and FIG. 15B is a sectional view taken along the line A-A in FIG. 15A.

The wiring substrate of the eighth exemplary embodiment of this invention differs from the seventh exemplary embodiment in the aspect that the wiring substrate is provided with protruding electrodes at given positions of conductors.

In other words, wiring substrate 1200 composed of a resin substrate, for instance, has wiring traces 1320 formed thereon, and protruding electrodes 1310 at given positions of wiring traces 1320, as shown in FIG. 15A. Wiring traces 1320 are comprised of insulation resins 1330 on the surface of substrate 1200 and conductors 1340 overlaid on them, and protruding electrodes 1310 are formed on conductors 1340, as shown in FIG. 15B. Protruding electrodes 1310 are made of the same material as conductors 1340.

Here, the given positions, on which protruding electrodes 1310 are provided, means the positions for making connections with lead electrodes of an electronic component such as a semiconductor chip, or the positions corresponding to electrodes of a chip component, etc. to be mounted on them.

According to this structure, there can be realized the wiring substrate of excellent productivity since it can form protruding electrodes 1310 integrally with wiring traces 1320.

Moreover, wiring traces 1320 having protruding electrodes 1310 can be formed in fine pitches by using a transfer mold provided with concavities, as will be discussed in the following manufacturing method. In addition, protruding electrodes 1310 can be formed easily with a high aspect ratio and uniform height.

Substrate 1200, insulation resin 1330 and conductors 1340 can be made of the same materials as described in the seventh exemplary embodiment.

It is desirable that the hardening temperature of conductors 1340 composed of a conductive resin is higher than that of insulation resin 1330 when lead electrodes of an electronic component and protruding electrodes 1310 are connected by fusing them. This is because conductors 1340 become hardened when wiring traces 1320 are transferred to substrate 1200 if the hardening temperature of insulation resin 1330 is higher than that of conductors 1340. If the transfer is made at a temperature equal to or lower than the hardening temperature of conductor 1340, on the other hand, it is likely that insulation resin 1330 deforms under protruding electrodes 1310 to increase the risk of short-circuiting between adjoining protruding electrodes 1310 when making connections with the lead electrodes of the electronic component through protruding electrodes 1310.

When conductors 1340 are formed of a solder material, it is desirable that the melting point of the solder, or conductors 1340, is higher than the hardening temperature of insulation resin 1330. This is because insulation resin 1330 and conductors 1340 get mixed when wiring traces 1320 are transferred to substrate 1200, since conductors 1340 has melted already when insulation resin 1330 becomes hardened if the melting point of conductors 1340 is lower than that of insulation resin 1330. This may results in wiring traces 1320 not having the desired electrical resistances. However, this condition does not apply if they do not mix.

According to the eighth exemplary embodiment of the present invention, there can be formed wiring traces 1320 having a substantially improved bonding strength of insulation resin 1330 to both substrate 1200 and conductors 1340 attributable to it adhesion. The above can therefore achieve the wiring substrate of excellent flexibility and high reliability since separation of wiring traces 1320 from substrate 1200 is not likely even if substrate 1200 undergoes thermal stresses, external impacts, deformation and the like. According to this structure, there can be realized the wiring substrate of excellent in productivity since it can form protruding electrodes 1310 integrally in predetermined positions of conductors 1340.

Referring to FIG. 16A to FIG. 16F, description is provided of a method of manufacturing the wiring substrate of the eighth exemplary embodiment of this invention.

FIG. 16A to FIG. 16F are sectional views illustrating the method of manufacturing the wiring substrate according to the eighth exemplary embodiment of this invention.

Figure 16A:
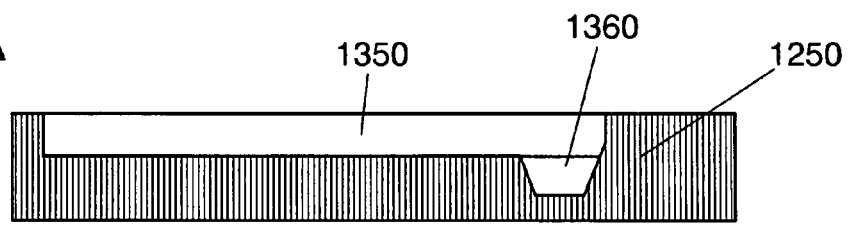
FIG. 16A is a sectional view illustrating a method of manufacturing the wiring substrate according to the eighth exemplary embodiment of the present invention.

Provided first is transfer mold 1250 having concavities 1350 formed in the positions corresponding to where wiring traces are provided, and closed-bottom cavities 1360 corresponding to the protruding electrodes formed in at least predetermined positions of inner bottom surfaces of concavities 1350, as shown in FIG. 16A. Transfer mold 1250 is made of a transfer-mold resin such as a thermosetting type silicone resin having a low elasticity and a high mold releasing property. Concavities 1350 corresponding to the wiring traces formed in transfer mold 1250 have 30 µm to 300 µm in width, 20 µm to 300 µm in thickness, and closed-bottom cavities 1360 corresponding to the protruding electrodes have 30 µm to 300 µm in diameter and 40 µm to 300 µm in depth, for example.

Concavities 1350 and closed-bottom cavities 1360 are formed in a transfer mold resin by a printing method such as imprinting or intaglio printing by using a metal mold provided with a configuration of the wiring traces and the protruding electrodes in a convex form. The transfer mold can be formed, for instance, by pouring the transfer mold resin such as a thermosetting type silicone resin into the metal mold, and hardening it under the condition of 150° C. in temperature for 0.5 hours. In addition, a mold releasing agent such as a fluorine lubricant may be coated at least inside concavities 1350 and closed-bottom cavities 1360 of transfer mold 1250 to help improve the releasability.

Figure 16B:
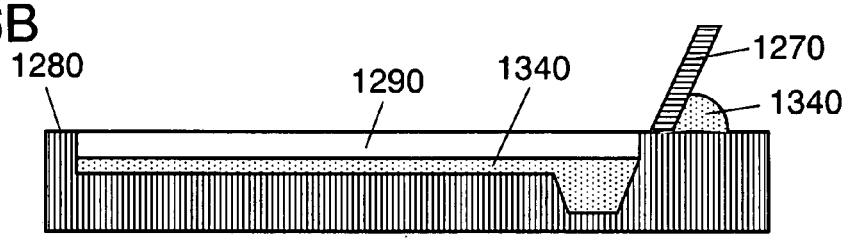
FIG. 16B is another sectional view illustrating the method of manufacturing the wiring substrate according to the eighth exemplary embodiment of the invention.

Next, concavities 1350 and closed-bottom cavities 1360 of transfer mold 1250 are filled with conductors 1340 consisting of a pasty conductive resin composed mainly of silver or a solder material, for instance, up to at most a level to completely fill closed-bottom cavities 1360 but not to reach outer face 1280 of concavities 1350 so as to leave voids 1290 therein, as shown in FIG. 16B. In this instance, an amount of conductors 1340 poured into concavities 1350 can be controlled by adjusting the size of meshes of a mask used for screen printing or a speed of squeegee 1270, for instance. Alternatively, voids 1290 may be formed by filling concavities 1350 with conductors 1340 up to an even level with outer face 1280 of concavities 1350, and drying them with natural air or at any temperatures below the hardening point. Or, voids 1290 may also be formed by pressing conductors 1340 forcibly into concavities 1350 with a roller made of a material having a weak adhesive to conductors 1340 (e.g., fluorocarbon resin, etc.).

Figure 16C:
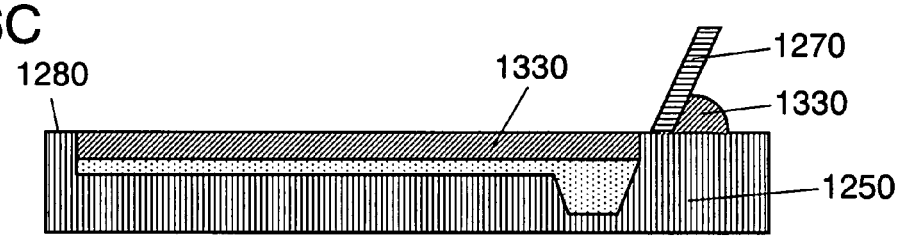
FIG. 16C is another sectional view illustrating the method of manufacturing the wiring substrate according to the eighth exemplary embodiment of the invention.

Next, the voids formed inside concavities 1350 are filled with insulation resin 1330 composed of an epoxy or the like resin, for instance, by using the method similar to conductors 1340, as shown in FIG. 16C.

Figure 16D:
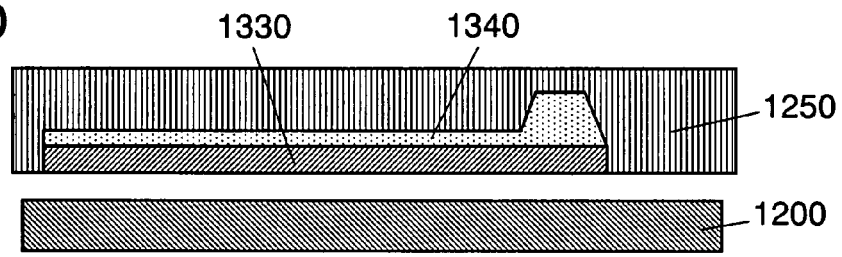
FIG. 16D is another sectional view illustrating the method of manufacturing the wiring substrate according to the eighth exemplary embodiment of the invention.

Transfer mold 1250 having its concavities filled with insulation resin 1330 and conductors 1340 is then positioned in alignment with substrate 1200 as shown in FIG. 16D.

Figure 16E:
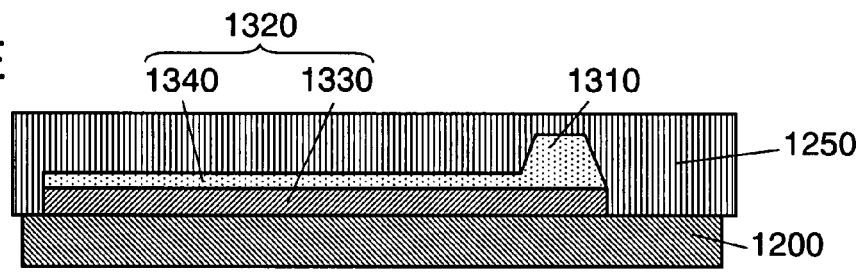
FIG. 16E is still another sectional view illustrating the method of manufacturing the wiring substrate according to the eighth exemplary embodiment of the invention.

While substrate 1200 and transfer mold 1250 are held in close contact to each other in their aligned position, as shown in FIG. 16E, they are heated at a temperature higher than the hardening temperature of insulation resin 1330 as well as the hardening temperature or the melting point of conductors 1340. This hardens the overlaid insulation resin 1330 and conductors 1340 to form wiring traces 1320 having protruding electrodes 1310.

If insulation resins 1330 and conductors 1340 containing epoxy resin have the hardening temperatures of 130° C. and 140° C. respectively, for instance, they are subjected to a temperature of 150° C. for a hardening time of about 60 minutes. If insulation resins 1330 contain epoxy resin of 150° C. in the hardening temperature, and conductors 1340 composed of solder of 220° C. in the melting point, they are subjected to a temperature of 230° C. for a hardening time of about 10 minutes.

The above hardening conditions are based on the assumption that protruding electrodes 1310 formed on conductors 1340 of wiring trace 1320 and lead electrodes of an electronic component are connected by such means as ultrasonic welding, pressure welding, crimp-on bonding, and the like.

When insulation resins 1330 and conductors 1340 are made of materials composed mainly of thermosetting type resins, on the other hand, it is necessary that they are hardened at a temperature not lower than the hardening temperature of insulation resins 1330 but not higher than the hardening temperature of the thermosetting type resin composing conductors 1340, in the case of making the connections between lead electrodes of the electronic component and protruding electrodes 1310 by means of fusion bonding of protruding electrodes 1310. Connections of the lead electrodes of the electronic component with protruding electrodes 1310 can be made by heating conductors 1340 to a temperature above the hardening temperature of the thermosetting type resin composing conductors 1340, and softening them once. It is not likely that wiring traces 1320 become deformed in shape under this condition, since the hardening temperature of insulation resin 1330 is lower than that of conductors 1340, so that already hardened insulation resin 1330 does not soft-en again.

When insulation resin 1330 is formed of a material composed mainly of a thermosetting type resin, and conductors 1340 are composed of a solder having a melting point higher than the hardening temperature of insulation resin 1330, conductors 1340 may be hardened by melting them once at a temperature higher than their melting point and cooling them thereafter. Conductors 1340 are heated to their melting point or above when connecting the lead electrodes of the electronic component with protruding electrodes 1310, so as to melt conductors 1340 once and to establish the connections with the lead electrodes of the electronic component. In other words, insulation resin 1330 does not soften since its hardening temperature is lower than the melting point of the solder that composes conductors 1340. There is hence no possibility for wiring traces 1320 to get deformed in the shape. It is desirable in this process to raise the temperature of protruding electrodes 1310 and their vicinities of conductors 1340, which confront the lead electrodes of the electronic component, to the melting point or higher.

This process hardens wiring traces 1320 having protruding electrodes 1310 on substrate 1200 in the same configuration as that of concavities 1350 with closed-bottom cavities 1360.

Figure 16F:
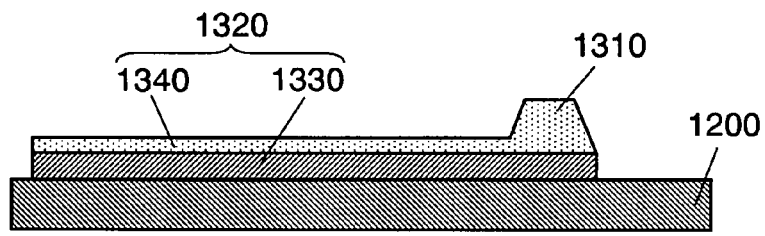
FIG. 16F is yet another sectional view illustrating the method of manufacturing the wiring substrate according to the eighth exemplary embodiment of the invention.

Accordingly, wiring traces 1320 having protruding electrodes 1310 of generally the same configuration as the concavities and of an uniform height are transferred and formed on substrate 1200, as shown in FIG. 16F, when the transfer mold is removed.

Ninth Exemplary Embodiment

Figure 17A:
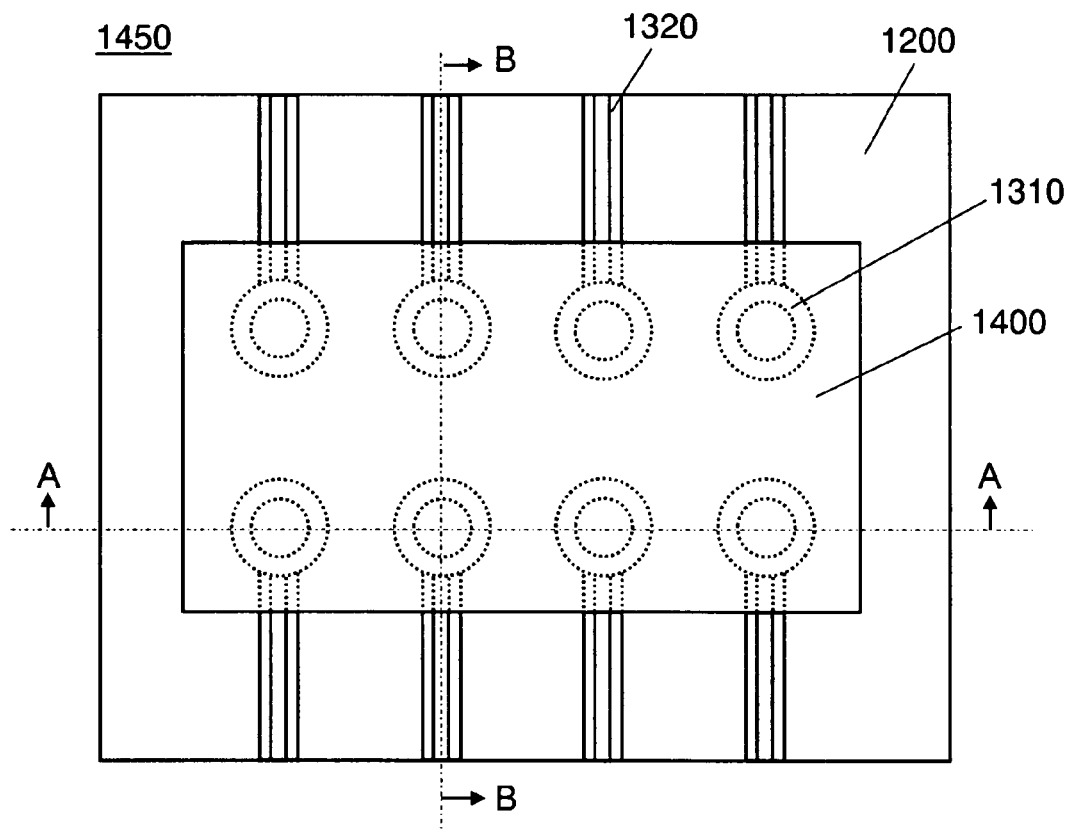
FIG. 17A is a plan view of an electronic component mounted body according to a ninth exemplary embodiment of the present invention.
Figure 17B:
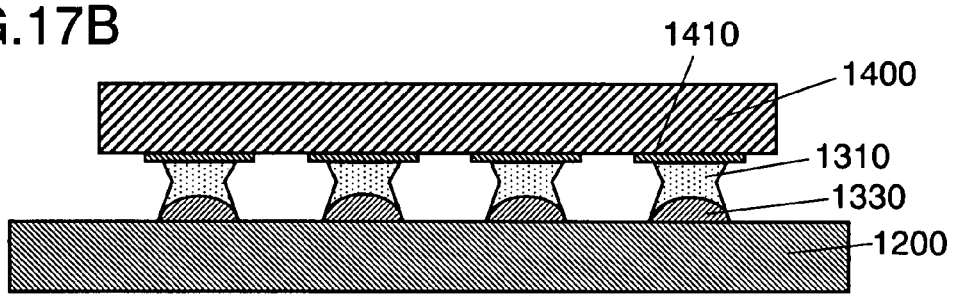
FIG. 17B is a sectional view taken along the line A-A in FIG. 17A.
Figure 17C:
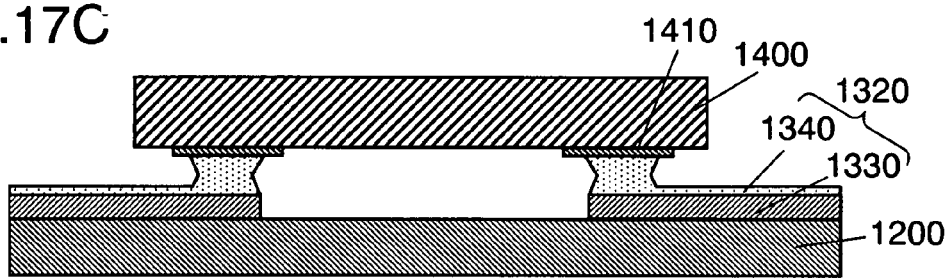
FIG. 17C is another sectional view taken along the line B-B in FIG. 17A.

FIG. 17A is a plan view of a wiring substrate according to the ninth exemplary embodiment of the present invention, FIG. 17B is a sectional view taken along the line A-A in FIG. 17A, and FIG. 17C is another sectional view taken along the line B-B in FIG. 17A.

In FIG. 17A to FIG. 17C, what is illustrated is electronic component mounted body 1450 constructed by connecting lead electrodes 1410 of electronic component 1400 such as a semiconductor chip to protruding electrodes 1310 formed on wiring traces 1320 of substrate 1200 manufactured according to the eighth exemplary embodiment.

According to this structure, electronic component mounting body 1450 can be manufactured with high productivity since wiring traces 1320 and protruding electrodes 1310 are formed at once by using a transfer mold, which makes a process unnecessary to form the protruding electrodes on lead electrodes 1410 for making connections with lead electrodes 1410 of electronic component 1400.

This structure also ensure reliable connections since it allows the connections established even by fusion bonding of protruding electrodes 1310 lead electrodes 1410 of electronic component 1400, as described in the eighth exemplary embodiment. Moreover, this structure can make the connections of protruding electrodes 1310 across a fixed distance of the connections in the configuration of so-called drum-like shape having a thin middle portion, as shown in FIG. 17B or FIG. 17C, due to a high wettability of protruding electrodes 1310, if composed of solder, with lead electrodes 1410 of electronic component 1400 when the solder is re-melted.

This results in realizing highly reliable connections where separation of the electrodes is not likely to occur in the interfaces between lead electrodes 1410 and protruding electrodes 1310 since the concentration of stresses is alleviated in the interfaces as compared with the conventional solder bumps, which tend to become barrel shapes. It is more effective in this case to reduce a size of surfaces of protruding electrodes 1310 that come in contact with lead electrodes 1410, as compared to the size of lead electrodes 1410.

Tenth Exemplary Embodiment

Figure 18A:
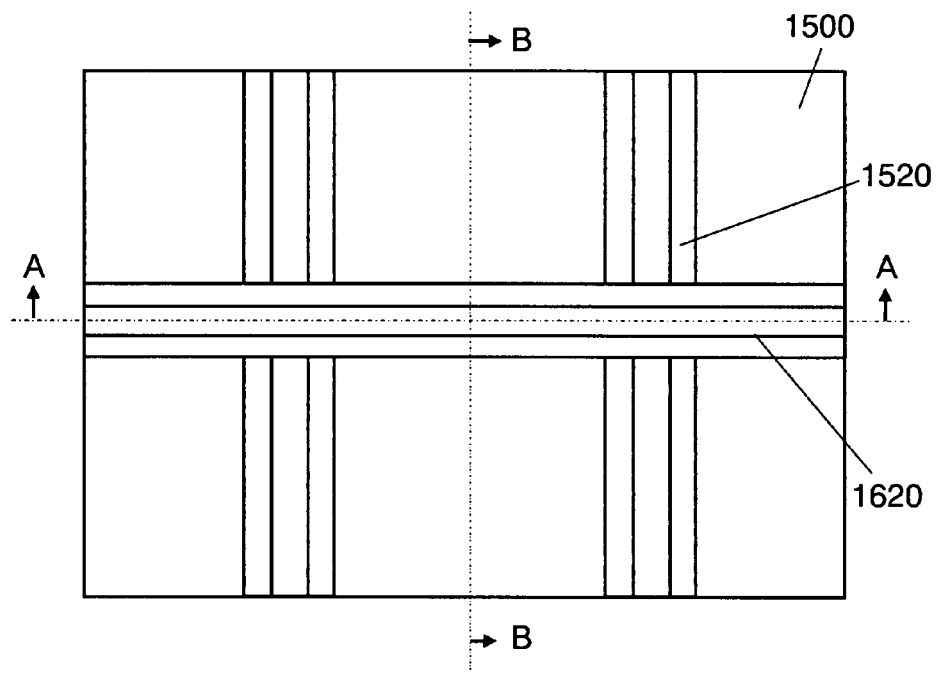
FIG. 18A is a plan view of a wiring substrate according to a tenth exemplary embodiment of the present invention.
Figure 18B:
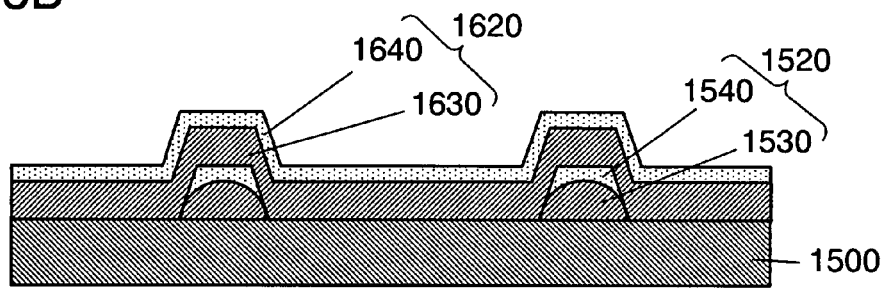
FIG. 18B is a sectional view taken along the line A-A in FIG. 18A.
Figure 18C:
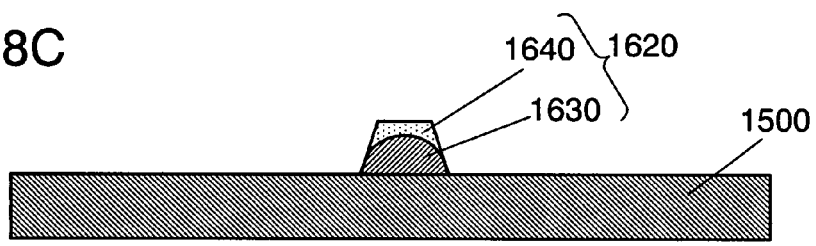
FIG. 18C is a sectional view taken along the line B-B in FIG. 18A.

FIG. 18A is a plan view of a wiring substrate according to the tenth exemplary embodiment of the present invention, FIG. 18B is a sectional view taken along the line A-A in FIG. 18A, and FIG. 18C is a sectional view taken along the line B-B in FIG. 18A, The wiring substrate of the tenth exemplary embodiment differs from the seventh exemplary embodiment in the aspect that wiring traces are overlaid in a three-dimensional structure.

As shown in FIG. 18A, the wiring substrate comprises first wiring trace 1520 on substrate 1500, and second wiring trace 1620 intersecting first wiring trace 1520 in a three-dimensional manner as shown in FIG. 18B. First wiring trace 1520 has an overlaid structure composed of first insulation resin 1530 and first conductor 1540. Likewise, second wiring trace 1620 has an overlaid structure composed of second insulation resin 1630 and second conductor 1640.

This structure can obviate the need of making three-dimensional wiring through viaholes as in the case of conventional multi-layered substrates, and all wiring traces can be formed on one and the same surface of substrate 1500 except for intersecting portions of the wiring traces. This substrate allows a flat-surface mounting of electronic components that otherwise require connections with three-dimensional wiring traces.

Furthermore, this structure can also achieve the three-dimensional wiring of strong adhesion since second insulation resin 1630 of second wiring trace 1620 can be used as an interlayer insulation layer for first conductor 1540 of first wiring trace 1520. As a result, there is achieved the wiring substrate of an excellent reliability, in which separation of wiring traces from substrate 1500 and open wiring are not likely to occur even of a flexible type.

Referring to FIG. 19A to FIG. 19F, description is provided of a method of manufacturing the wiring substrate of the tenth exemplary embodiment of this invention.

FIG. 19A to FIG. 19F are sectional views illustrating the method of manufacturing the wiring substrate according to the tenth exemplary embodiment of this invention.

Figure 19A:
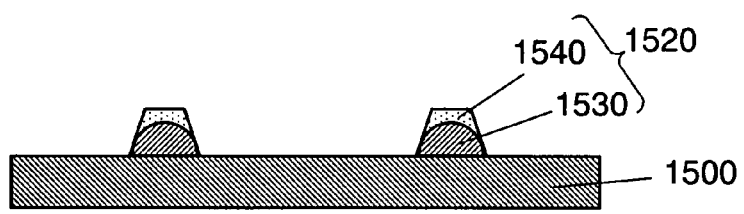
FIG. 19A is a sectional view illustrating a method of manufacturing the wiring substrate according to the tenth exemplary embodiment of the present invention.

Provided first is a wiring substrate having first wiring trace 1520 on substrate 1500, as shown in FIG. 19A, which is produced according to the same manufacturing method as the seventh exemplary embodiment.

Figure 19B:
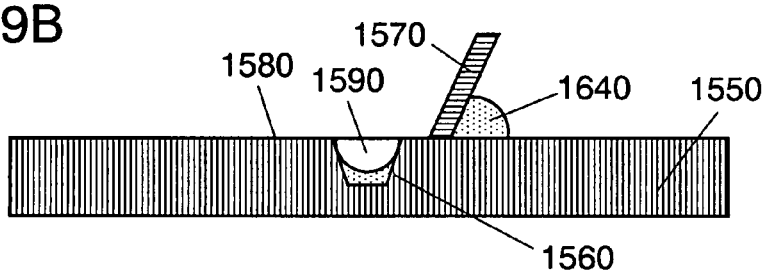
FIG. 19B is another sectional view illustrating the method of manufacturing the wiring substrate according to the tenth exemplary embodiment of the invention.

Next, concavity 1560 formed in a position of transfer mold 1550 corresponding to the second wiring trace is filled with second conductor 1640 consisting of a pasty conductive resin composed mainly of silver or a solder material, for instance, up to at most a level not to reach outer face 1580 of concavity 1560 so as to leave void 1590 therein by using squeegee 1570 of the screen printing, as shown in FIG. 19B. Here, transfer mold 1550 is made of a transfer mold resin such as a thermosetting type silicone resin having a low elasticity and a high mold releasing property. Void 1590 in concavity 1560 is formed by the same method as the seventh exemplary embodiment.

Figure 19C:
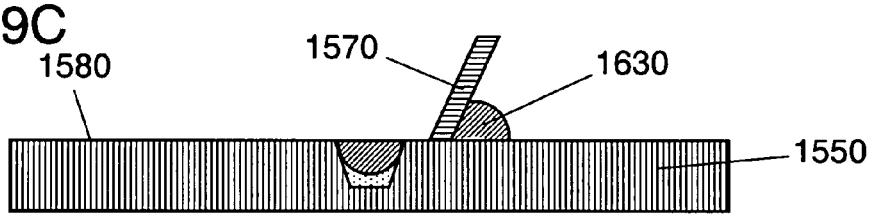
FIG. 19C is another sectional view illustrating the method of manufacturing the wiring substrate according to the tenth exemplary embodiment of the invention.

Next, the void formed inside concavity is filled with second insulation resin 1630 composed of an epoxy or the like resin, for instance, by using the method similar to second conductor 1640, as shown in FIG. 19C.

Figure 19D:
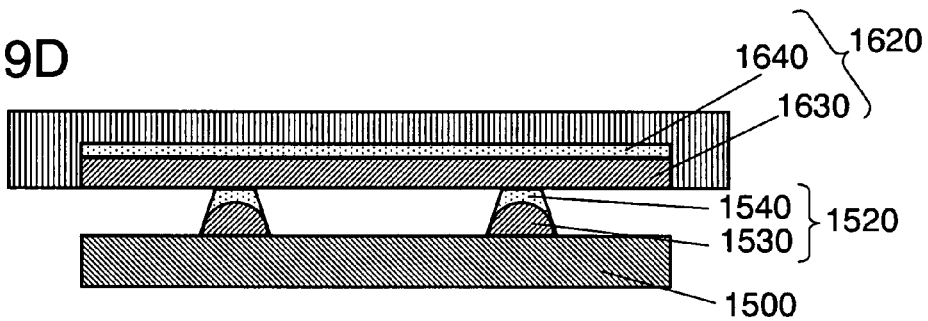
FIG. 19D is another sectional view illustrating the method of manufacturing the wiring substrate according to the tenth exemplary embodiment of the invention.

Transfer mold 1550 having its concavity 1560 filled with second insulation resin 1630 and second conductor 1640 is then positioned in alignment with the wiring substrate having first wiring trace 1520 formed thereon, as shown in FIG. 19D. Transfer mold 1550 illustrated in FIG. 19D is a sectioned view of concavity 1560 shown in FIG. 19C, but along its longitudinal direction in order to help clarify its relation to first wiring trace 1520.

Figure 19E:
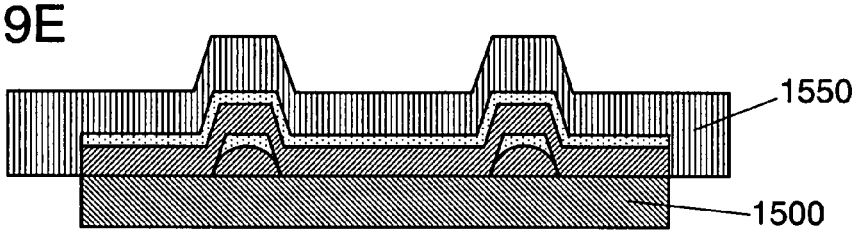
FIG. 19E is still another sectional view illustrating the method of manufacturing the wiring substrate according to the tenth exemplary embodiment of the invention.

Next, transfer mold 1550 is deformed along the shape of first wiring trace 1520 as shown in FIG. 19E. Second wiring trace 1620 is hardened by heating it at a temperature equal to or higher than the hardening temperature of second insulation resin 1630 and second conductor 1640 held in the above state. If second insulation resin 1630 and second conductor 1640 contain a thermosetting type resin composed mainly of epoxy resin, for instance, they are subjected to a temperature of 150° C. for a hardening time of about 60 minutes.

This process hardens second wiring trace 1620 on substrate 1500 in the same configuration as the shape of concavity 1560 and in the three-dimensionally wired position on top of first wiring trace 1520.

Figure 19F:
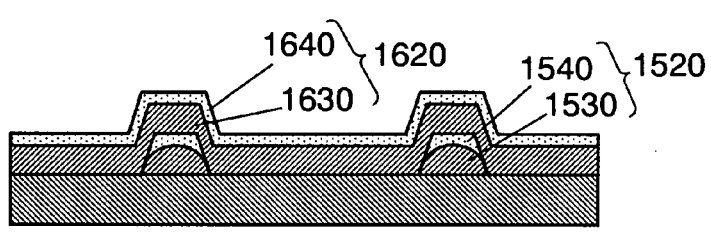
FIG. 19F is yet another sectional view illustrating the method of manufacturing the wiring substrate according to the tenth exemplary embodiment of the invention.

Accordingly, second wiring trace 1620 wired three-dimensionally with a portion of first wiring trace 1520 formed on substrate 1500 is transferred, as shown in FIG. 19F, when the transfer mold is removed.

In the wiring substrate of the tenth exemplary embodiment of this invention, it is necessary to maintain spaces among first wiring traces 1520 of such an extent that transfer mold 1550 for second wiring trace 1620 can be deformed sufficiently along the outer configuration across first wiring traces 1520. Second wiring traces 1620 can be formed in fine pitches within an acceptable limit of transfer even in this case.

In an another example of wiring substrate of the tenth exemplary embodiment of this invention, it is also possible to form a protruding electrode on any of the first conductor of the first wiring trace and the second conductor of the second wiring trace in the same manner as the eighth exemplary embodiment.

As a result of the above, this embodiment provides the wiring substrate with three-dimensional wiring traces, which allows mounting of electronic components such as semiconductor chips easily through protruding electrodes formed thereon. This wiring substrate is also useful for making an electronic component mounted body having electronic components mounted thereon, in the like manner as the ninth exemplary embodiment.

Figure 10A:
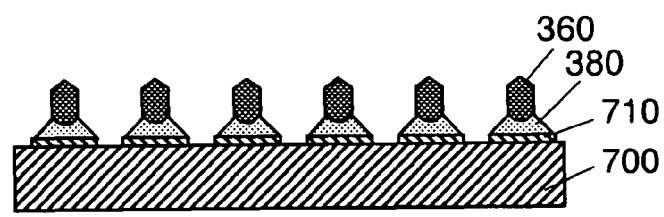
FIG. 10A is a sectional view illustrating an other example of the method of manufacturing the electronic component mounted body according to the fifth exemplary embodiment of the present invention.
Figure 10B:
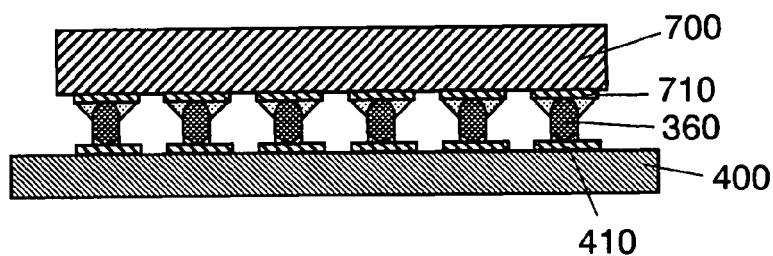
FIG. 10B is another sectional view illustrating the other example of the method of manufacturing the electronic component mounted body according to the fifth exemplary embodiment of the invention.
Figure 10C:
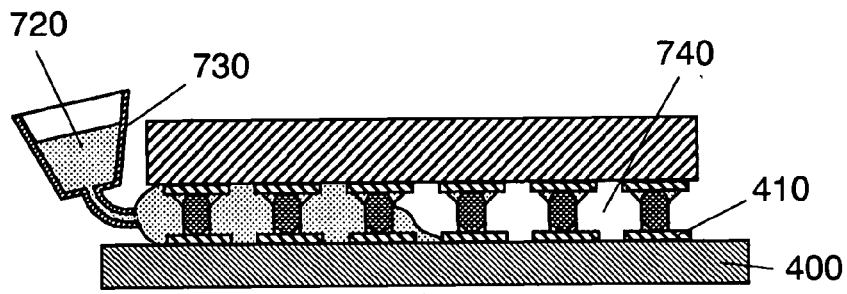
FIG. 10C is still another sectional view illustrating the other example of the method of manufacturing the electronic component mounted body according to the fifth exemplary embodiment of the invention.
Figure 10D:
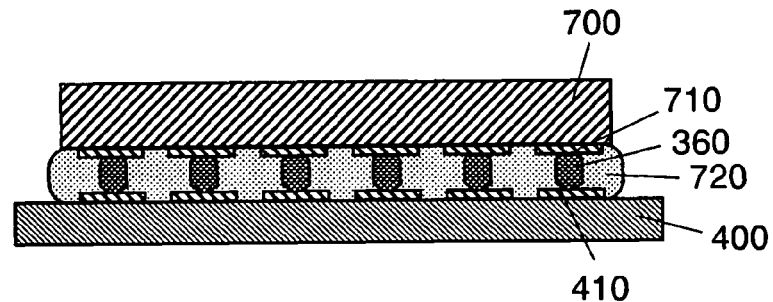
FIG. 10D is yet another sectional view illustrating the other example of the method of manufacturing the electronic component mounted body according to the fifth exemplary embodiment of the invention.
Figure 20A:
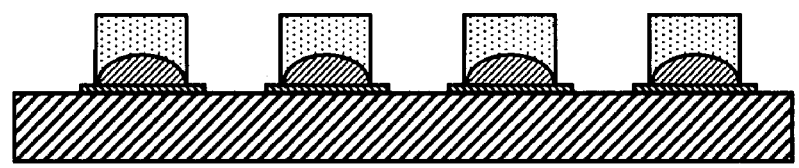
FIG. 20A is a sectional view showing another example of the protruding electrodes according to one of the exemplary embodiments of the present invention.
Figure 20B:
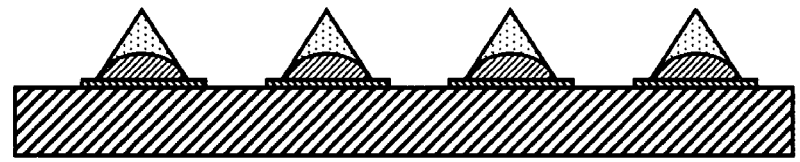
FIG. 20B is a sectional view showing still another example of the protruding electrodes according to one of the exemplary embodiments of the present invention.
Figure 21A:
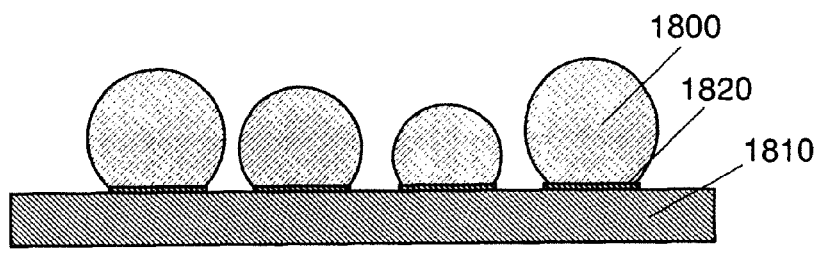
FIG. 21A is a sectional view illustrating conventional protruding electrodes.
Figure 21B:
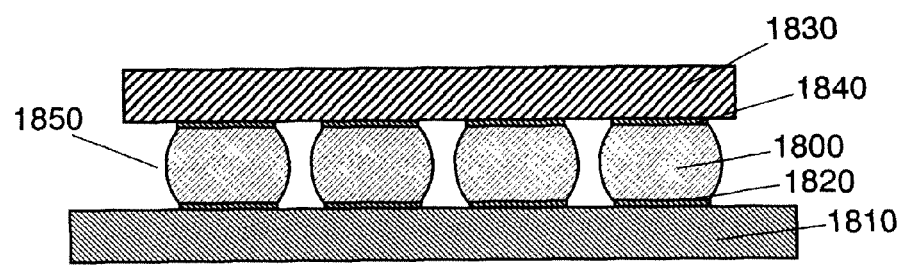
FIG. 21B is another sectional view illustrating the conventional protruding electrodes.
Figure 21C:
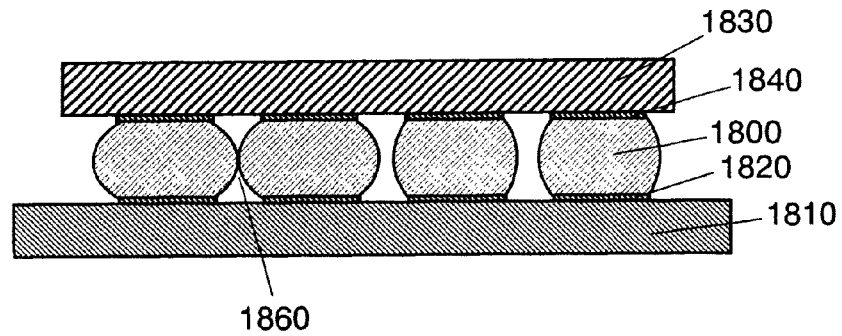
FIG. 21C is still another sectional view illustrating the conventional protruding electrodes.

In the first through the third exemplary embodiments and the seventh through the tenth exemplary embodiments of this invention, although what have been described are examples of the protruding electrodes having such configurations as trapezoid in section and conical shape, the scope of this invention is not limited to these examples. The protruding electrodes can rather be of any shape without particular limitations as long as they can be separated from concavities of a transfer mold, such as rectangle in section as shown in FIG. 20A, and triangle in section as shown in FIG. 10B, and they still exhibit the like advantages. Again, the protruding electrodes need not be restricted specifically to the circular shape in plan configuration as long as they can be separated from concavities of the transfer mold,

INDUSTRIAL APPLICABILITY

The protruding electrodes for connecting electronic components and the electronic component mounted bodies of the present invention are useful in the Geld of semiconductor packaging, wherein large size semiconductor devices represented by large-scale integration circuits, image pickup devices or packages containing them, etc. are mounted on substrates.

The invention claimed is:

1. A method of manufacturing a protruding electrode for connecting an electronic component, the method comprising:
   filling a plurality of concavities of a transfer mold having the plurality of concavities of a predetermined shape for the protruding electrode, with a second conductor containing a conductive resin, up to a level not to reach an outer face of the plurality of concavities of the transfer mold;
   filling a first conductor containing a conductive resin up to the outer face of the plurality of concavities of the transfer mold on the second conductor;
   heating by positioning and mounting the plurality of concavities of the transfer mold on a lead electrode of an electronic component or a wiring electrode of a substrate; and
   removing the transfer mold from either the lead electrode of the electronic component or the wiring electrode of the substrate.

2. The method of claim 1 for manufacturing a protruding electrode for connecting an electronic component, wherein the transfer mold comprises a transfer mold resin having a low modulus of elasticity and a high mold-releasing property.

3. The method of claim 2 for manufacturing a protruding electrode for connecting an electronic component, wherein the transfer mold resin includes a thermosetting type silicone resin.

4. The method of claim 1 for manufacturing a protruding electrode for connecting an electronic component, wherein a hardening temperature of the first conductor is lower than a hardening temperature of the second conductor.

5. The method of claim 1 for manufacturing a protruding electrode for connecting an electronic component, wherein a squeegee is used for filling the first conductor.

6. A method of manufacturing an electronic component mounted body by electrically connecting a wiring substrate provided with a plurality of wiring electrodes with an electronic component having a plurality of lead electrodes in positions corresponding to the wiring electrodes, the method comprising:
   filling a plurality of concavities of a transfer mold having the plurality of concavities of a predetermined shape for the protruding electrode, with a second conductor containing a conductive resin, up to a level not to reach an outer face of the plurality of concavities of the transfer mold;
   filling a first conductor containing a conductive resin up to the outer face of the plurality of concavities of the transfer mold on the second conductor;
   heating by positioning and mounting the plurality of concavities of the transfer mold on a lead electrode of an electronic component or a wiring electrode of a substrate;
   removing the transfer mold from either the lead electrode of the electronic component or the wiring electrode of the substrate, and foaming the protruding electrode on either the lead electrode of the electronic component or the wiring electrode of the substrate; and
   connecting the protruding electrodes formed on any of the lead electrodes of the electronic component and the wiring electrodes of the substrate with the corresponding ones of the wiring electrodes of the substrate and the lead electrodes of the electronic component.

7. The method of claim 6 for manufacturing an electronic component mounted body, wherein the step of heating is carried out at a temperature not lower than a hardening temperature of the first conductor but not higher than a hardening temperature of the second conductor.

8. The method of claim 6 for manufacturing an electronic component mounted body, wherein the step of connecting the protruding electrodes is carried out at a temperature equal to or higher than a hardening temperature or a melting point of the second conductor.

9. The method of claim 6 for manufacturing an electronic component mounted body, wherein a hardening temperature of the first conductor is lower than a hardening temperature of the second conductor.

10. The method of claim 6 for manufacturing an electronic component mounted body, wherein a squeegee is used for filling the first conductor.

* * * * *

UNITED STATES PATENT AND TRADEMARK OFFICE
CERTIFICATE OF CORRECTION

| | | |
|---|---|---|
| PATENT NO. | : 8,033,016 B2 | |
| APPLICATION NO. | : 11/883801 | |
| DATED | : October 11, 2011 | |
| INVENTOR(S) | : Kunio Hibino et al. | |

It is certified that error appears in the above-identified patent and that said Letters Patent is hereby corrected as shown below:

Specifically, in Column 33, line 20, it currently reads "present invention are useful in the Geld of semiconductor", but it should read --present invention are useful in the <u>field</u> of semiconductor--

In Column 34, line 27 it currently reads "the substrate, and foaming the protruding electrode on" but it should read --the substrate, and <u>forming</u> the protruding electrode on--

Signed and Sealed this
First Day of May, 2012

David J. Kappos
*Director of the United States Patent and Trademark Office*